United States Patent
Hammond et al.

(10) Patent No.: US 9,892,879 B2
(45) Date of Patent: Feb. 13, 2018

(54) ENCAPSULATED MICRO-ELECTROMECHANICAL SYSTEM SWITCH AND METHOD OF MANUFACTURING THE SAME

(75) Inventors: Jonathan Hale Hammond, Oak Ridge, NC (US); Julio Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 343 days.

(21) Appl. No.: 13/348,277

(22) Filed: Jan. 11, 2012

(65) Prior Publication Data

US 2012/0175715 A1 Jul. 12, 2012

Related U.S. Application Data

(60) Provisional application No. 61/431,692, filed on Jan. 11, 2011.

(51) Int. Cl.
| | |
|---|---|
| H01L 29/84 | (2006.01) |
| H01L 21/02 | (2006.01) |
| H01H 49/00 | (2006.01) |
| H01H 1/00 | (2006.01) |
| H01H 59/00 | (2006.01) |
| B81C 1/00 | (2006.01) |

(52) U.S. Cl.
CPC ............ *H01H 49/00* (2013.01); *B81C 1/0023* (2013.01); *H01H 1/0036* (2013.01); *H01H 59/0009* (2013.01); *B81B 2201/014* (2013.01); *B81C 2203/0145* (2013.01)

(58) Field of Classification Search
CPC ............. H01L 2924/1461; H01L 41/09; H01L 41/0926; H01L 41/0933; H01L 41/094; H01L 41/1136; B81B 3/0018; B81C 1/0015; B81C 1/0023; B81C 1/00246; B81C 1/00333; H01H 1/0036; H01H 59/0009
USPC .............. 257/415, 417, E29.324; 438/50, 52
See application file for complete search history.

(56) References Cited

U.S. PATENT DOCUMENTS

| | | | |
|---|---|---|---|
| 6,331,257 B1 * | 12/2001 | Loo ........................ | B81B 3/0072 216/13 |
| 7,280,014 B2 * | 10/2007 | Potter ................ | H01H 59/0009 200/181 |
| 7,745,892 B1 | 6/2010 | Ivanov et al. | |
| 8,159,056 B1 | 4/2012 | Kim et al. | |

(Continued)

OTHER PUBLICATIONS

Non-Final Office Action for U.S. Appl. No. 14/874,704, mailed Mar. 9, 2016, 10 pages.

(Continued)

*Primary Examiner* — Ermias Woldegeorgis
(74) *Attorney, Agent, or Firm* — Withrow & Terranova, P.L.L.C.

(57) ABSTRACT

Encapsulated MEMS switches are disclosed along with methods of manufacturing the same. A non-polymer based sacrificial layer is used to form the actuation member of the MEMS switch while a polymer based sacrificial layer is used to form the enclosure that encapsulates the MEMS switch. The first non-polymer based sacrificial layer allows for highly reliable MEMS switches to be manufactured while also protecting the MEMS switch from carbon contamination. The polymer based sacrificial layer allows for the manufacture of more spatially efficient encapsulated MEMS switches.

28 Claims, 26 Drawing Sheets

(56) References Cited

U.S. PATENT DOCUMENTS

| | | | |
|---|---|---|---|
| 8,653,699 B1 | 2/2014 | Dening et al. | |
| 2002/0171121 A1* | 11/2002 | Ozgur | B81C 1/00246 257/532 |
| 2003/0080082 A1* | 5/2003 | Chinn | B81B 3/0005 216/2 |
| 2007/0236307 A1* | 10/2007 | Liu | H01P 1/127 333/105 |
| 2009/0071807 A1 | 3/2009 | Kominato et al. | |
| 2009/0243063 A1* | 10/2009 | Yoon | B81C 1/00333 257/678 |
| 2011/0049649 A1* | 3/2011 | Anderson | B81C 1/00333 257/415 |

OTHER PUBLICATIONS

Non-Final Office Action for U.S. Appl. No. 14/874,704, dated Sep. 16, 2016, 10 pages.
Final Office Action for U.S. Appl. No. 14/874,704, dated May 5, 2017, 13 pages.
Advisory Action for U.S. Appl. No. 14/874,704, dated Aug. 11, 2017, 3 pages.
Notice of Allowance for U.S. Appl. No. 14/874,704, dated Aug. 28, 2017, 8 pages.

* cited by examiner

ENCAPSULATED MICRO-ELECTROMECHANICAL SYSTEM SWITCH AND METHOD OF MANUFACTURING THE SAME

RELATED APPLICATIONS

This application claims the benefit of provisional patent application Ser. No. 61/431,692, filed Jan. 11, 2011, the disclosure of which is hereby incorporated herein by reference in its entirety.

FIELD OF THE DISCLOSURE

The present disclosure relates to methods and devices for manufacturing micro-electro-mechanical system (MEMS) switches on semiconductor substrates.

BACKGROUND

FIG. 1 illustrates a MEMS switch 10 formed on a semiconductor substrate 12. The MEMS switch 10 includes an actuation member 14, such as the illustrated cantilever, which is may be formed from a conductive material. The actuation member 14 may have an anchored end 16, an arm 18, and a contact portion 20. Defined on the semiconductor substrate 12 are an anchor pad 22, an actuator plate 24, and a contact pad 26. The anchored end 16 of the actuation member 14 is attached and electrically coupled to the anchor pad 22. The arm 18 of the actuation member 14 is suspended over the actuator plate 24 and the contact portion 20 is suspended over the contact pad 26. To actuate the MEMS switch 10, an electric potential is generated between the actuator plate 24 and the arm 18. The electric potential creates an attractive force which pulls the arm 18 and thereby the contact portion 20 towards the semiconductor substrate 12. As a result, the actuation member 14 moves the contact portion 20 into electrical contact with the contact pad 26 to close the MEMS switch 10.

As shown in FIG. 1, the MEMS switch 10 is capped with a silicon (Si) or silicon dioxide ($SiO_2$) cap 34. The cap 34 is attached to the semiconductor substrate 12 using layer 36 formed from a glass frit paste. On the exterior of the cap 34, the semiconductor substrate 12 has input/output pads 38 for connecting to the anchor pad 22, the actuator plate 24, and the contact pad 26. The problem with the design shown in FIG. 1 is its spatial inefficiency.

Referring now to FIG. 2, FIG. 2 illustrates a perspective view of the MEMS switch 10 shown in FIG. 1, which clearly demonstrates the spatial inefficiency of the MEMS switch 10. The MEMS switch 10 is excessively thick and may prevent flip chip assembly. Also, the glass frit layer 36 requires a large area. Exacerbating the spatial inefficiency of the MEMS switch 10 is the additional area of the semiconductor substrate 12 required to reveal the input/output pads 38 for the MEMS switch 10.

Thus, what is needed are more spatially efficient MEMS switches and methods of manufacturing the same.

SUMMARY

The present disclosure relates generally to fabrication devices and methods of manufacturing encapsulated MEMS switches. The MEMS switches may be highly reliable since the contact areas of the MEMS switches are formed using a non-polymer based sacrificial layer, such as a metal layer, a dielectric layer, and/or a semiconductor layer. Nevertheless, the enclosure that encapsulates the MEMS switch may be formed through the use of a polymer based sacrificial layer. This allows for the manufacturing of encapsulated MEMS switches with more spatially efficient profiles.

In one embodiment, encapsulated MEMS switches are formed on a substrate which, for example, may be a complementary metal-oxide semiconductor (CMOS) wafer. An actuator plate and a contact pad for the MEMS switch may be provided over the substrate and a first non-polymer based sacrificial layer is provided over the actuator plate and contact pad. The actuation member of the MEMS device may be formed on the first non-polymer based sacrificial layer.

Next, a second polymer based sacrificial layer is provided over the actuation member. While polymer based sacrificial layers are typically associated with unwanted carbon contamination, the first non-polymer based sacrificial layer protects the MEMS switch contact portions from carbon contamination. A first encapsulation layer may then be provided over the second polymer based sacrificial layer. Subsequently, the second polymer based sacrificial layer and the first non-polymer based sacrificial layer may be removed.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
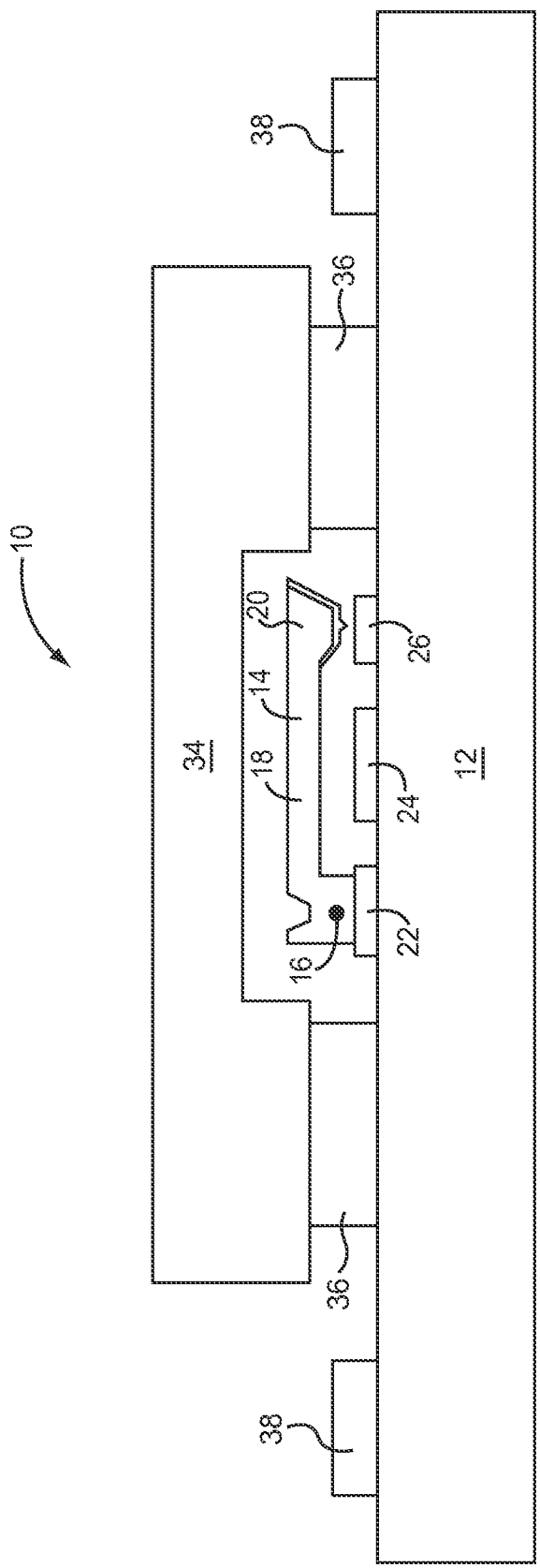
FIG. 1 is a cross sectional view of a prior art MEMS switch.
Figure 2:
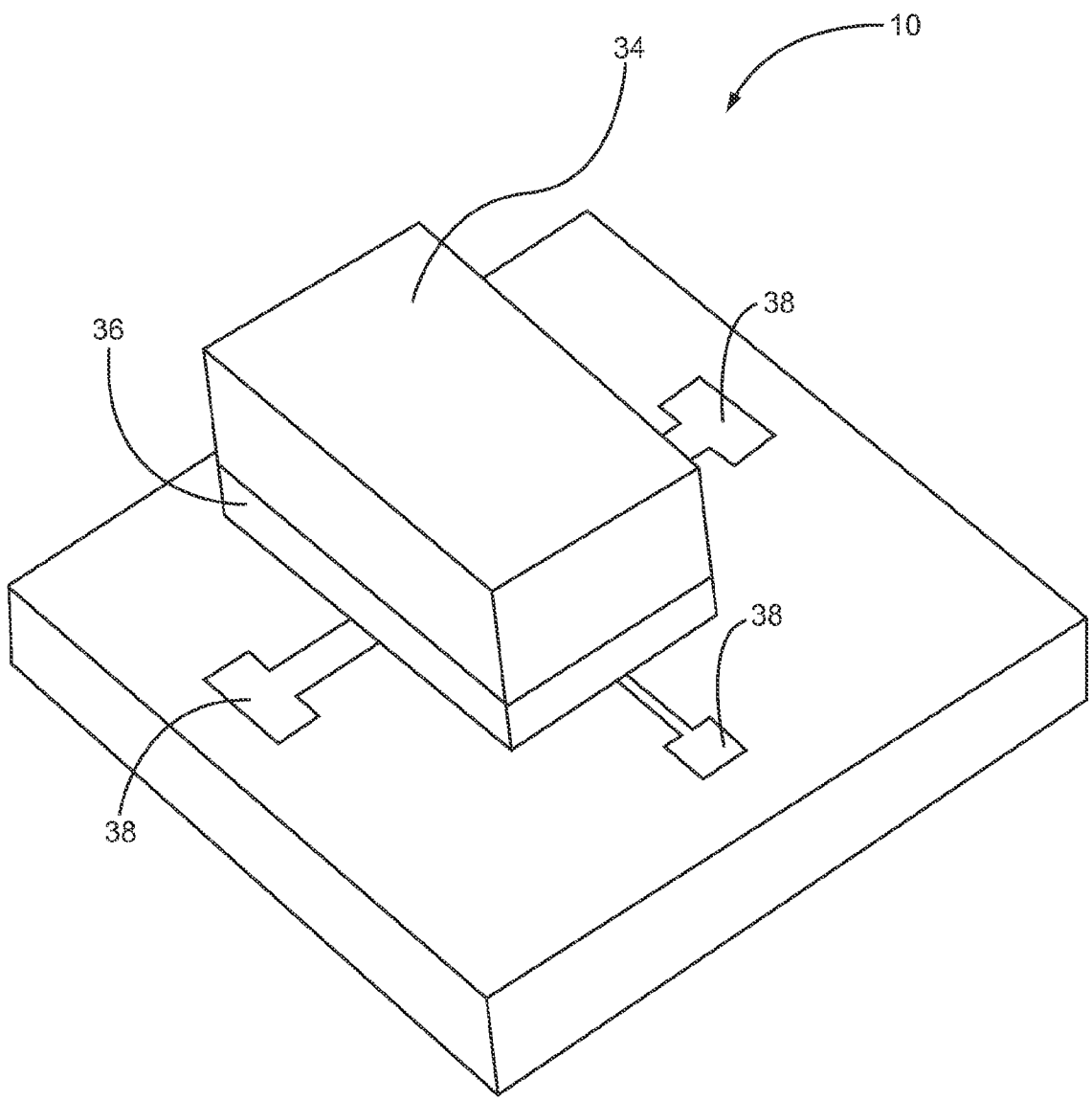
FIG. 2 illustrates a perspective view of the prior art MEMS switch shown in FIG. 1.
Figure 3:
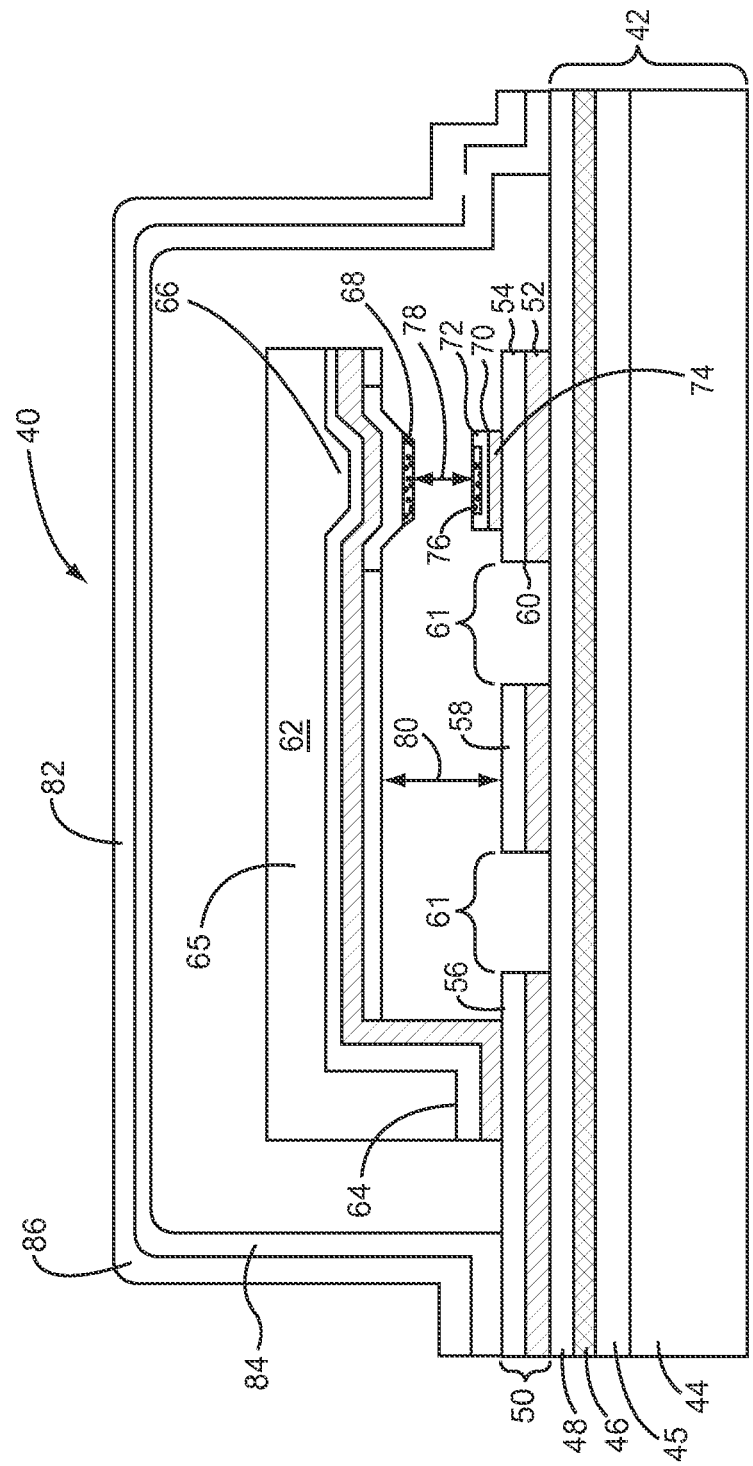
FIG. 3 illustrates a cross sectional view of one embodiment of a MEMS switch manufactured in accordance with this disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these con- FIG. 3 illustrates one embodiment of MEMS switch 40 formed on a substrate 42 in accordance with the disclosure. The substrate 42 may be provided as part of or be integral to a semiconductor or a glass die or wafer. For example, the substrate 42 shown in FIG. 3 forms a complementary metal-oxide semiconductor (CMOS) wafer. In this embodiment, the substrate 42 includes a semiconductor handle layer 44, a metal backend layer 45, an insulating layer 46, and a dielectric layer 48. The semiconductor handle layer 44 shown in FIG. 3 may be a few hundred μm in thickness, the metal backend layer 45 may be approximately 4.5 μm in thickness, the insulating layer 46 may be a few μm in thickness, while the dielectric layer 48 may be approximately 6 μm in thickness.

Any type of suitable semiconductor technology may be utilized to form the MEMS switch 40. Although the illustrated embodiment utilizes silicon (Si) as the material of the semiconductor handle layer 44, other embodiments of the substrate 42 may utilize other semiconductor materials such as gallium arsenide (GaAs), gallium nitride (GaN), indium phosphide (InP), silicon germanium (SiGe), sapphire, and the like. The semiconductor handle layer 44 may include additional layers below, above, or integrated to the semiconductor handle layer 44. Alternatively or additionally, other embodiments of the substrate 42 may or may not include the metal backend layer 45, an insulating layer 46, and a dielectric layer 48 depending on the type of semiconductor technology being employed. Furthermore, it should be noted that other active semiconductor devices, such as transistors and diodes, may be formed on the substrate 42 if desired.

In this embodiment, the semiconductor handle layer 44 resides under the insulating layer 46 and the dielectric layer 48. Thus, high voltage devices, which may exceed ten (10) volts in operation, may be connected to control the operation of the MEMS switch 40 or associated circuitry. The insulating layer 46 and dielectric layer 48 are generally formed from oxides or nitrides, such as Silicon Dioxide (SiO$_2$) or Silicon Nitride (SiN) and these layers 46, 48 may range in thickness from 0.1 μm to 10 μm and are formed over the semiconductor handle layer 44. Other layers may be provided below, above, or integrated to the insulating and dielectric layers 46, 48 in accordance with the semiconductor technology being employed.

A conductive layer 50 may be formed over the substrate 42 to form the conductive portions of the MEMS switch 40. Substrate 42 and conductive layer 50 may include additional layers, such as connecting layers, passivation layers, adhesion layers, and dielectric layers, inserted among or between any of these various layers without departing from the essence of the disclosure. The conductive layer 50 may be formed as part of, be mounted on, and/or be integral to the substrate 42.

In FIG. 3, the MEMS switch 40 is formed on the conductive layer 50 during fabrication of the semiconductor device. As such, the present disclosure avoids the need to fabricate MEMS switches on a different substrate from the devices that contain circuitry to be associated with the MEMS switch 40. In the alternative, the MEMS switch 40 may be mounted on the substrate 42 and connected to modules of associated circuitry. The substrate 42 is created using a complementary metal oxide semiconductor (CMOS) fabrication process. As such, the semiconductor structure may be effectively a silicon-on-insulator (SOI) configuration where the MEMS switch 40 is formed over, if not directly on, the substrate 42, which may take the form of a silicon-on-insulator (SOI) wafer.

In the illustrated example, conductive layer 50 includes an adhesive layer 52 and a conductive material 54. The conductive material 54 may be any made from any type of suitable conductive material, but preferably from a non-reactive type of conductive material which, such as, gold (Au). Other non-reactive type conductive materials which may be used to from the conductive layer are Rhodium (Rh), Iridium (Ir), Ruthenium (Ru), Ruthenium dioxide (RuO$_2$), and/or an Iridium oxide (IrO$_x$), etc. To ensure that the conductive material 54 adheres to the substrate 42, the adhesive layer 52 is provided between the substrate 42 and the conductive material 54. Adhesive layer 52 may be made from any suitable material, such as titungsten (TiW), titanium (Ti), or chromium (Cr). The adhesive layer 52 may be provided to ensure that the conductive material 54 adheres to the dielectric layer 48 because the conductive material 54 may not easily attach to the dielectric layer 48 made from a material, such as SiN or SiO$_2$.

MEMS switch 40 may include components, such as an anchor pad 56, actuator plate 58, and contact pad 60, formed from the conductive layer 50 over the substrate 42. Gaps 61 are formed in the conductive layer 50 to define the anchor pad 56, actuator plate 58, and contact pad 60 and functionally separate these components. In this example, an actuation member 62 is formed on the conductive layer 50 which has an anchored end 64 that anchors and electrically connects the actuation member 62 to the anchor pad 56. It should be noted however that, alternatively, MEMS switch 40 may not be electrically connected to or include an anchor pad 56. For example, the actuation member 62 may be physically anchored to a component, such as the anchor pad 56, but be electrically connected to another component (not shown).

Next, actuation member 62 may include an arm 65 that extends from the anchored end 64 and is suspended over the actuator plate 58. The arm 65 extends from the anchored end 64 and may define a contact portion 66. The contact portion 66 may be formed to have a contact area 68 that is suspended over the contact pad 60. In this embodiment, a bump pad 70 has been formed on the contact pad 60. The bump pad 70 may be formed from a hard conductive material 72 and an adhesion layer 74. The hard conductive material 72 may for example be a Gold-Ruthenium alloy (Au—Ru), Ruthenium (Ru), Rhodium (Rh), Iridium (Ir), Ruthenium dioxide (RuO$_2$), and/or an Iridium oxide (IrO$_x$). The bump pad 70 provides a contact area 76. When the MEMS switch 40 is open (as illustrated in FIG. 3), the distance between the contact area 68 of the actuation member 62 and the contact area 76 on the bump pad 70 (or contact pad 60 if no bump pad 70 is provided) defines a contact gap 78 of the MEMS switch 40. The distance between the actuation member 62 and the actuator plate 58 defines the actuator gap 80. Thus, in this case, the actuator gap 80 is defined by the distance between the arm 65 and the actuator plate 58. An indentation is formed on the bottom surface of the actuation member 62 so that the contact area 68 on the actuation member 62 is positioned below the portion of the arm 65 formed over the contact pad 60. This helps ensure that the contact gap 78 is smaller than the actuator gap 80 which prevents shorts between the actuator plate 58 and the anchor pad 56 when the MEMS switch 40 is closed (not shown).

The MEMS switch 40 is enclosed within a domed-shaped enclosure 82. The domed-shaped enclosure 82 is spatially efficient since a profile of the domed-shaped enclosure 82 more closely fit the configuration of the MEMS switch 40. In one embodiment, the domed-shaped enclosure 82 is formed by encapsulation layers 84, 86. As explained below, the encapsulation layer 84 is formed over a polymer based sacrificial layer provided to mold the domed-shaped enclosure 82. Subsequently, after the polymer based sacrificial layer is removed, the encapsulation layer 86 is provided to seal the domed-shaped enclosure 82.

Figure 4:
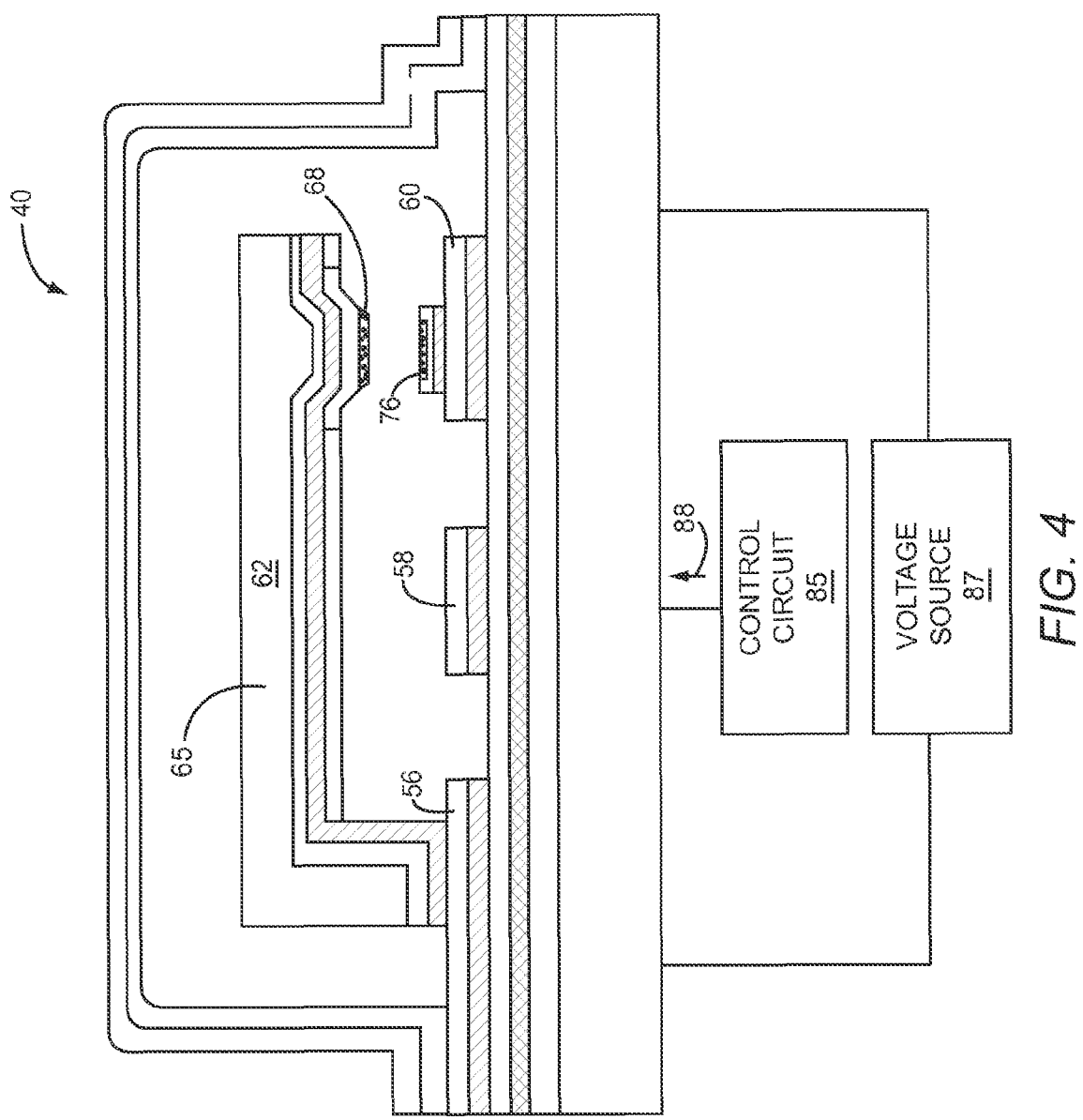
FIG. 4 illustrates one configuration of the MEMS switch shown in FIG. 3 coupled to a control circuit that actuates the MEMS switch and a voltage source.

FIG. 4 illustrates one exemplary configuration of the MEMS switch 40 shown in FIG. 3. To actuate the arm 65 and close the MEMS switch 40, the contact area 68 on the actuation member 62 is moved toward contact area 76 on the bump pad 70 so that contact area 68 and contact area 76 are electrically coupled to one another. In the illustrated embodiment, closing the MEMS switch 40 creates an electrical path through the actuation member 62 from the anchor pad 56 to the contact pad 60. To actuate the actuation member 62, a control circuit 85 may be provided which sends a control signal 88 to the actuator plate 58 and creates an electromagnetic field. The electromagnetic field creates an electrostatic force which moves the arm 65 toward the actuator plate 58 thereby moving the actuation member 62 from the open position to the closed position. A voltage source 87 may be connected between the anchor pad 56 and the contact pad 60 so that a voltage signal may be provided or received from circuitry (not shown) coupled to the anchor pad 56 and contact pad 60.

Figure 5A:
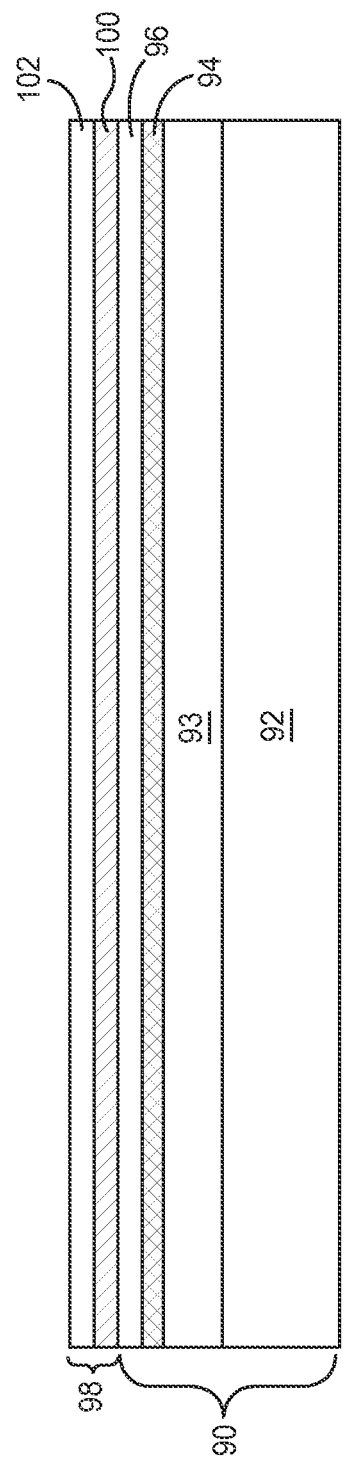
FIGS. 5A-5Q illustrate exemplary procedures for manufacturing a fabrication device that may be utilized to create an encapsulated MEMS switch according to this disclosure.

As shall be explained in further detail below, MEMS switches may be manufactured in accordance with the disclosure by providing MEMS fabrication devices having dual sacrificial layers, a first non-polymer based sacrificial layer to mold the actuation member and a second polymer based sacrificial layer to mold an encapsulation layer. FIGS. 5A-5Q illustrates exemplary procedures for manufacturing one embodiment of a fabrication device that may be used to create an encapsulated MEMS switch.

Referring now to FIG. 5A, FIG. 5A shows one embodiment of a substrate 90 that includes a semiconductor handle layer 92, metal backend layer 93, an insulating layer 94, and a dielectric layer 96. A conductive layer 98 is placed over the substrate 90 and includes an adhesive layer 100 and a conductive material 102. In this example, the conductive layer 98 is placed directly on the substrate 90 and the adhesive layer 100 attaches the conductive material 102 to the dielectric layer 96 of the substrate 90.

Figure 5B:
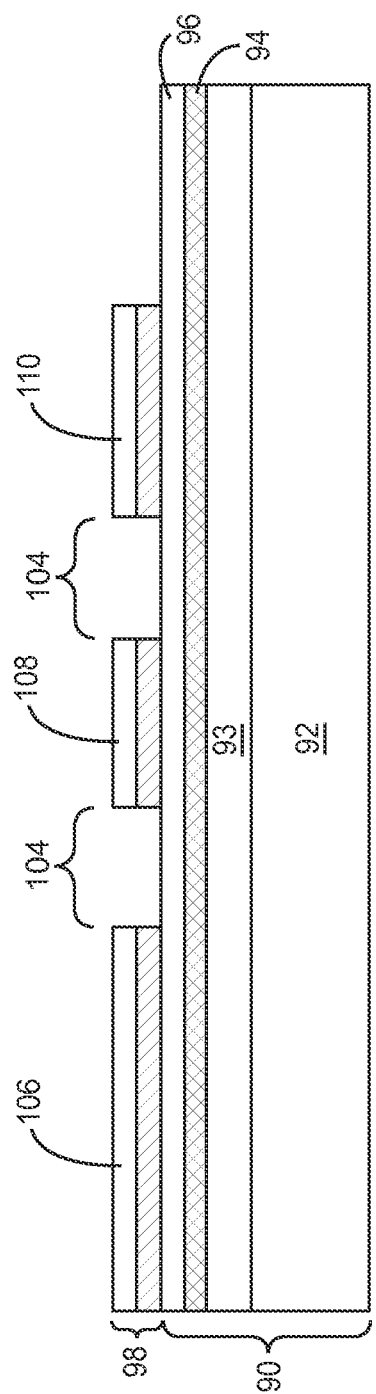
Figure 5C:
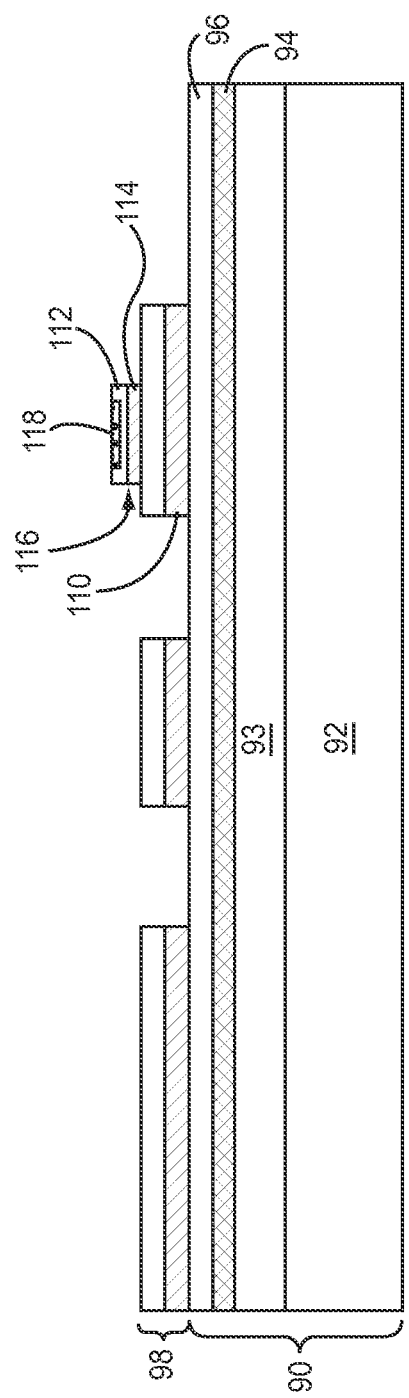

As shown in FIG. 5B, gaps 104 may then be patterned into the conductive layer 98 to form an anchor pad 106, an actuator plate 108, and a contact pad 110 over the substrate 90. A hard conductive layer 112 is attached over the conductive layer 98 with an adhesive layer 114 and patterned to form a bump pad 116 (FIG. 5C). The hard conductive layer 112 may use an etch back or lift-off metal process to pattern the hard conductive layer 112. In this particular example, the bump pad 116 defines a contact area 118 and is formed on the contact pad 110.

Figure 5D:
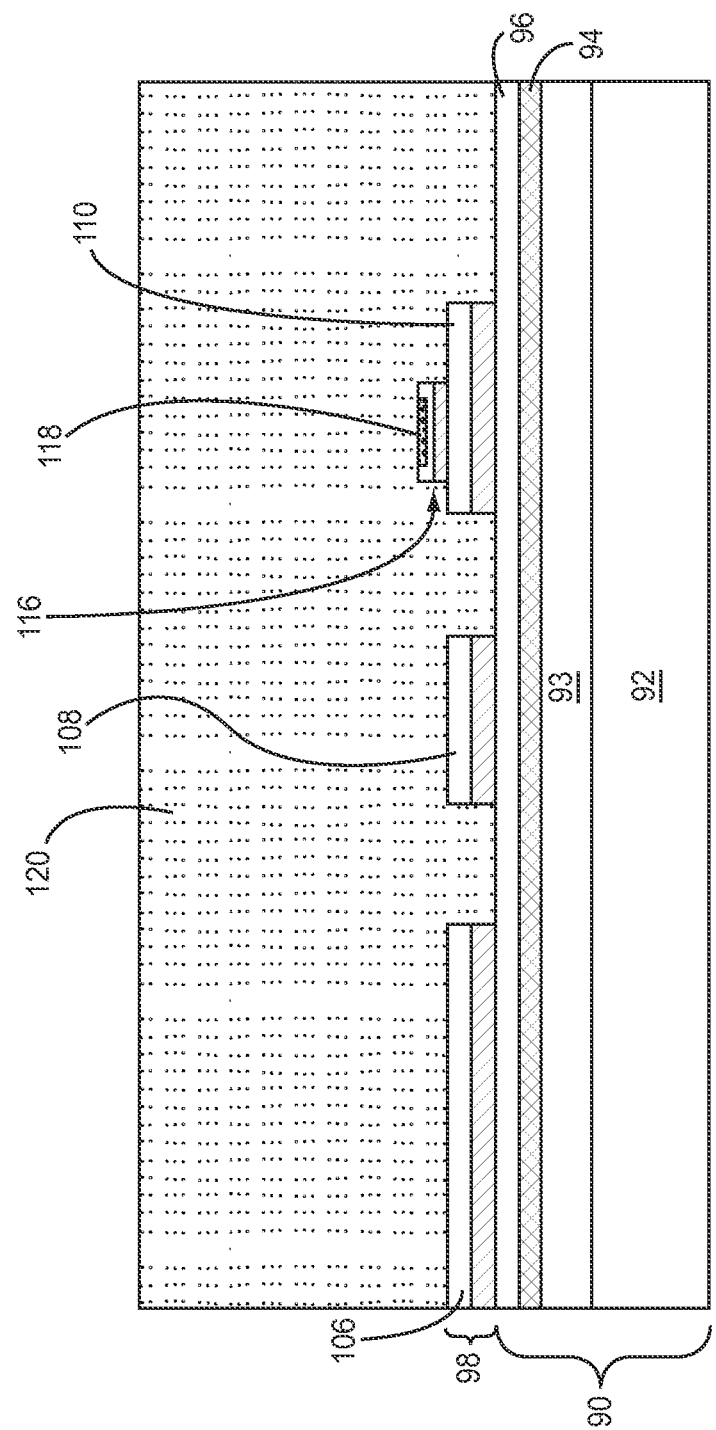

A first non-polymer based sacrificial layer 120 is also formed over the conductive material 102 (FIG. 5D). Thus, in this example, the first non-polymer based sacrificial layer 120 is provided over the conductive layer 98 prior to forming the actuation member of the MEMS switch. As shown in FIG. 5D, the first non-polymer based sacrificial layer 120 may be provided over the anchor pad 106, an actuator plate 108, and a contact pad 110. The first non-polymer based sacrificial layer 120 may be made from any non-polymer type material such as a metal, a dielectric, and/or a semiconductor material. In this example, the first non-polymer based sacrificial layer 120 is made from copper (Cu). Furthermore, the first non-polymer based sacrificial layer 120 covers and encloses the anchor pad 106, the actuator plate 108, the contact pad 110, as well as the contact area 118 on the bump pad 116.

Figure 5E:
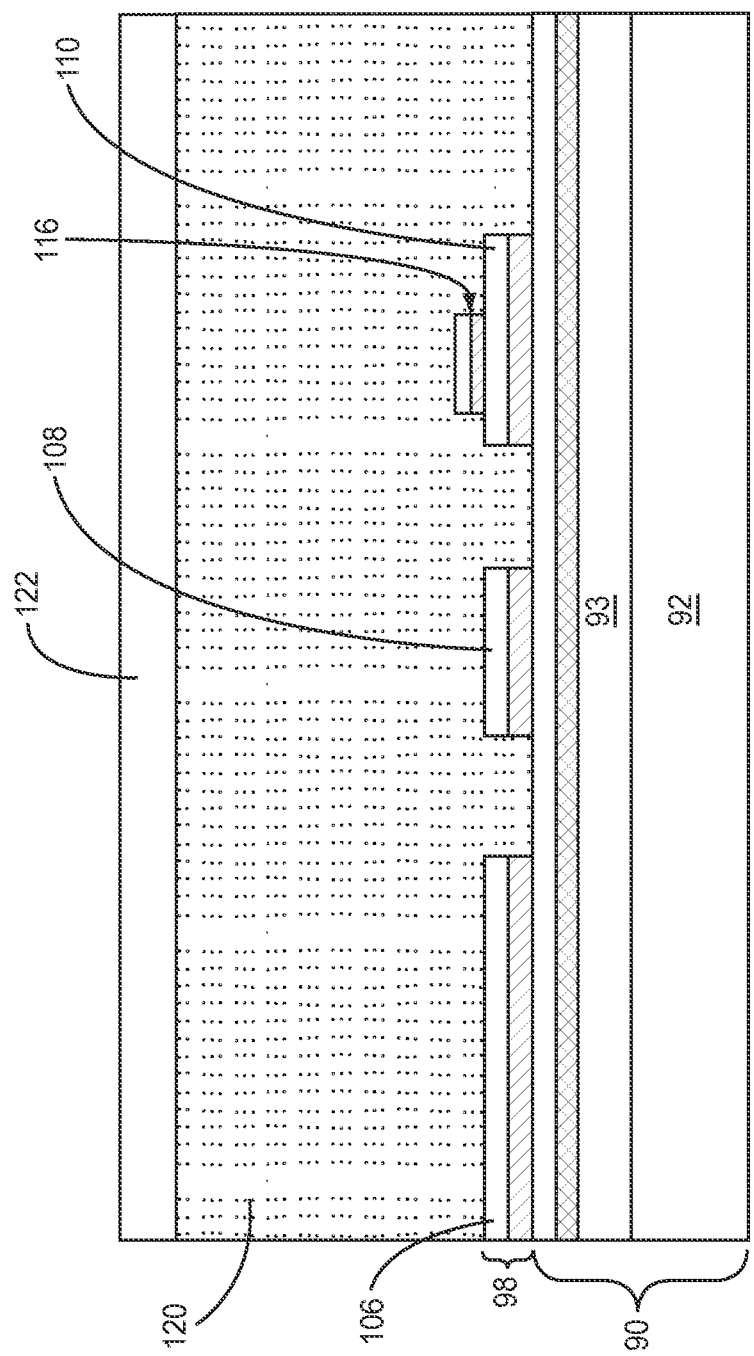
Figure 5F:
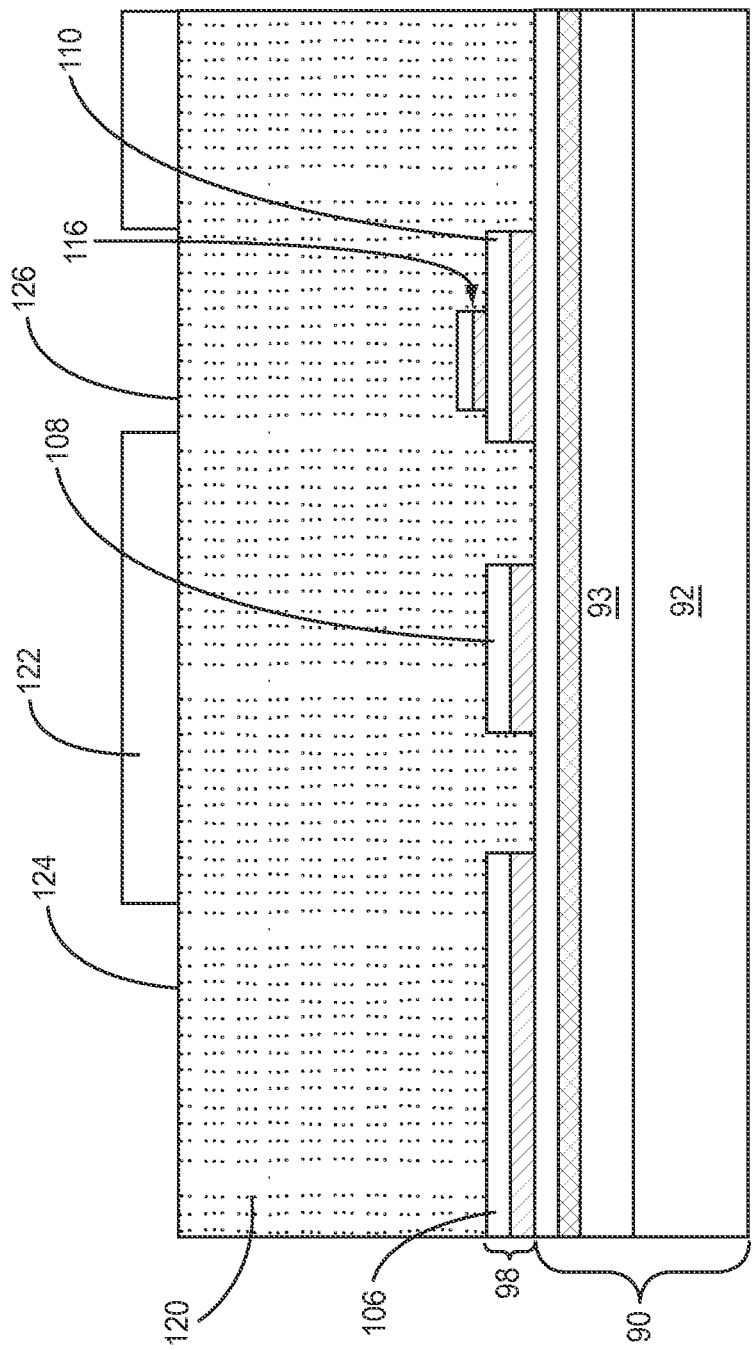
Figure 5G:
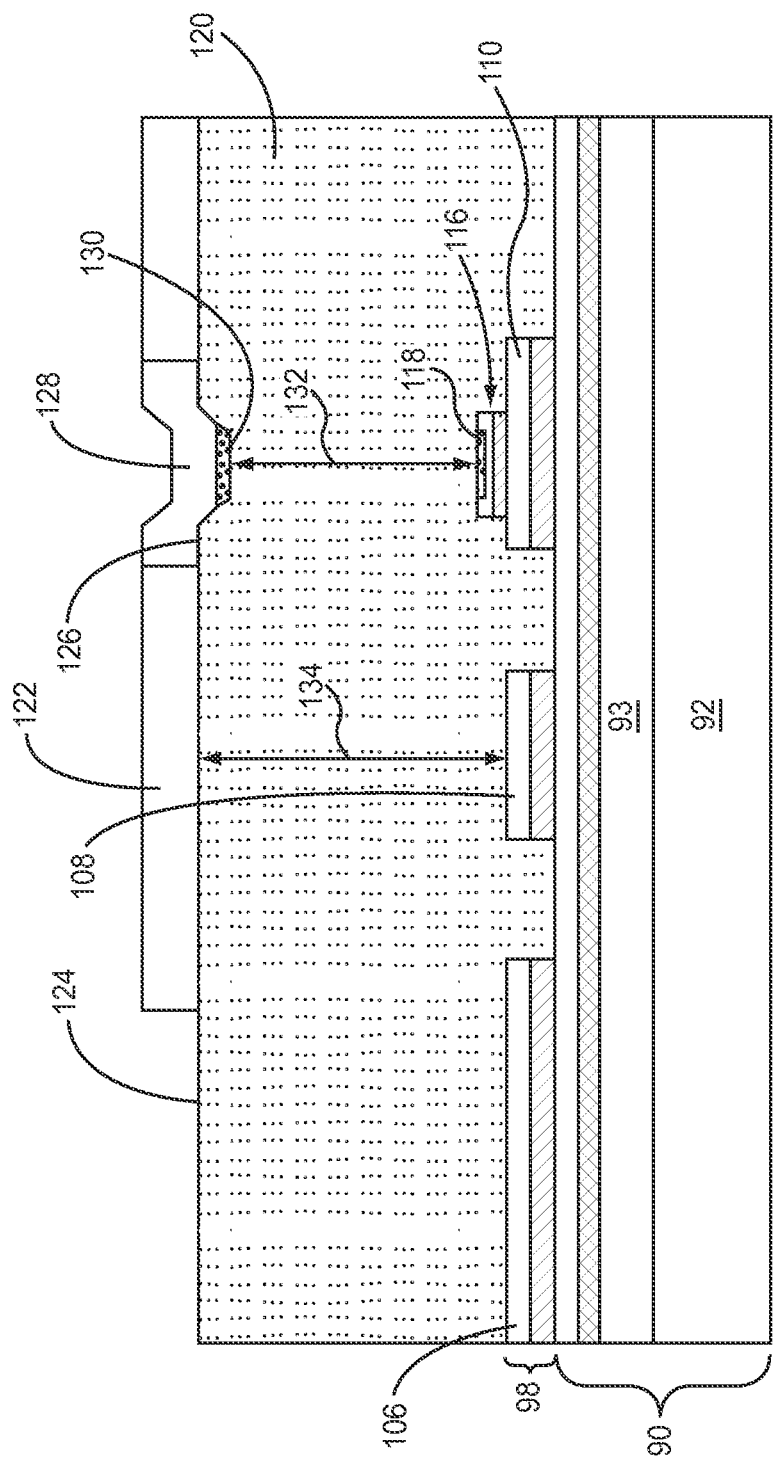

Next, a barrier layer 122 is provided over the first non-polymer based sacrificial layer 120 (FIG. 5E). The barrier layer 122 may be made from any suitable material such as TiW. The barrier layer 122 is then patterned to protect the desired portions of the first non-polymer based sacrificial layer 120 while exposing areas 124, 126 of the first non-polymer based sacrificial layer 120 (FIG. 5F). In this embodiment, a recess is formed at the exposed area 126 and a hard conductive layer 128 is provided within the recess (FIG. 5G). The hard conductive layer 128 provides the contact area 130 of an actuation member and is protected from carbon contaminants by the first non-polymer based sacrificial layer 120. Accordingly, the protection provided by the first non-polymer based sacrificial layer 120 allows for a cleaner contact area 130 once the MEMS switch is formed. Also, the recess may be formed in the first non-polymer based sacrificial layer 120 to have a high degree of planarization thereby forming the hard conductive layer 128 with a more planar contact area 130. The hard conductive layer 128 may be made from one or more hard conductive material such as Rhodium (Rh), Iridium (Ir), Ruthenium dioxide (RuO$_2$), Ruthenium (Ru), an Iridium oxide (IrO$_x$), or the like. This hard conductive layer 128 makes the MEMS switch more robust by allowing more force to be placed on the contact area 130. This embodiment utilizes clear field techniques to form an actuation member, however other embodiments may employ dark field techniques.

As explained in further detail below, the actuation member of the MEMS switch may be molded from the first non-polymer based sacrificial layer 120. There are several advantages to using the first non-polymer based sacrificial layer 120 rather than a polymer based sacrificial layer. For example, the first non-polymer based sacrificial layer 120 may make it easier to form a planar contact area 130 on the actuation member and a more planar arm. Furthermore, the size of a contact gap 132 and an actuator gap 134 can generally be made more consistent using the first non-polymer based sacrificial layer 120. Finally, the contact area 130 of the actuation member and the contact area 118 on the bump pad 116 are protected from carbon contaminants thereby lowering insertion losses created by carbon contamination and increasing the reliability of the MEMS switches.

Figure 5H:
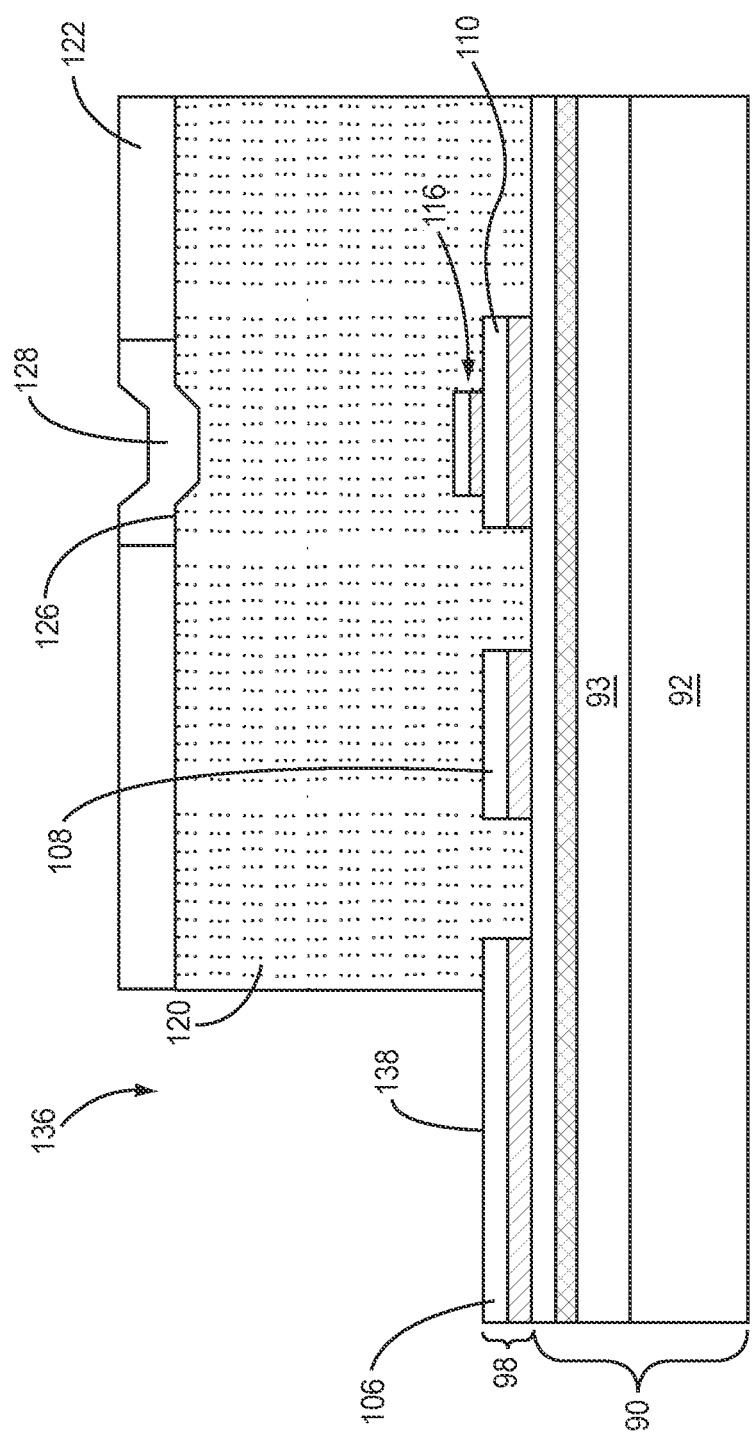
Figure 5I:
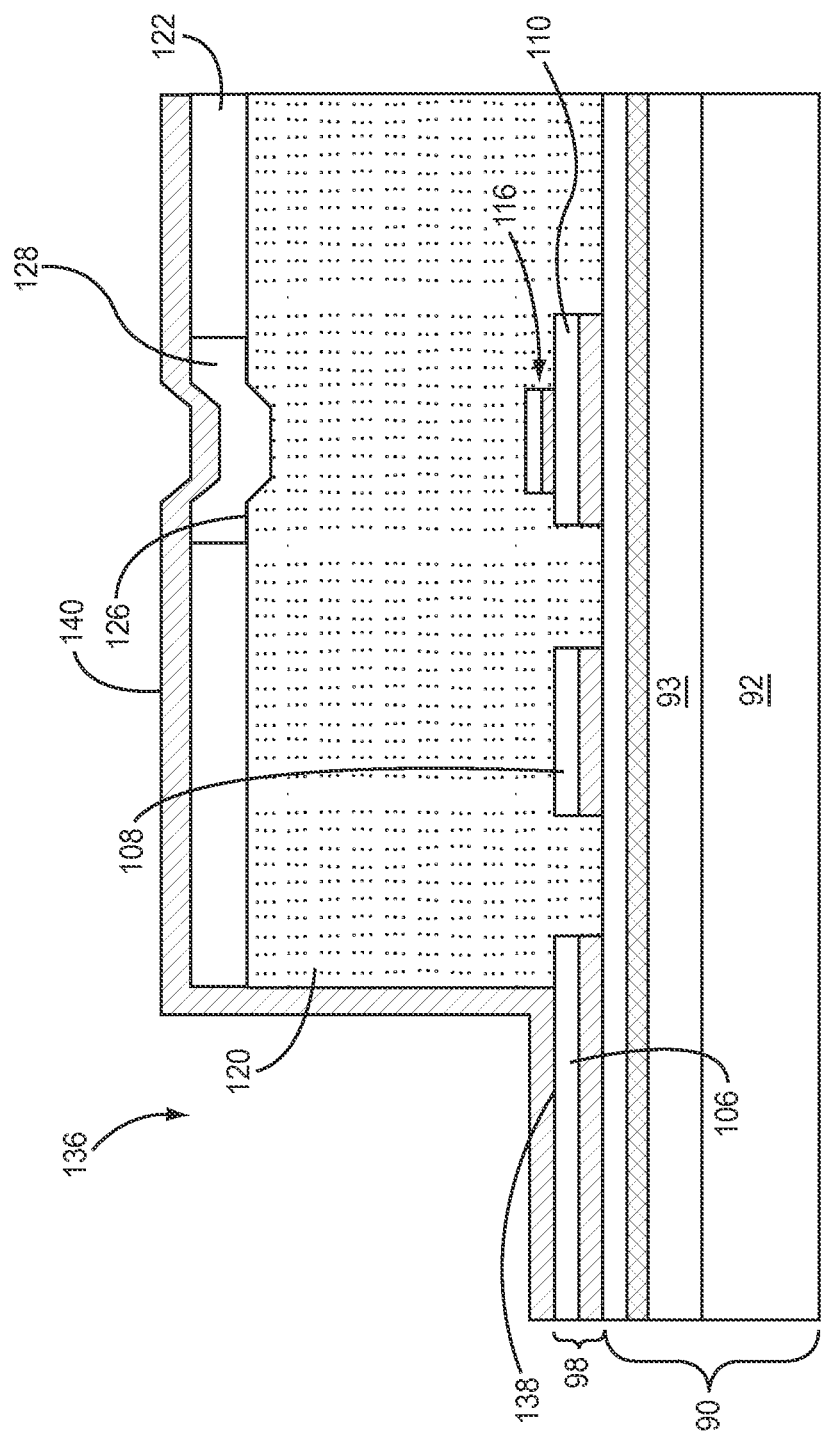
Figure 5J:
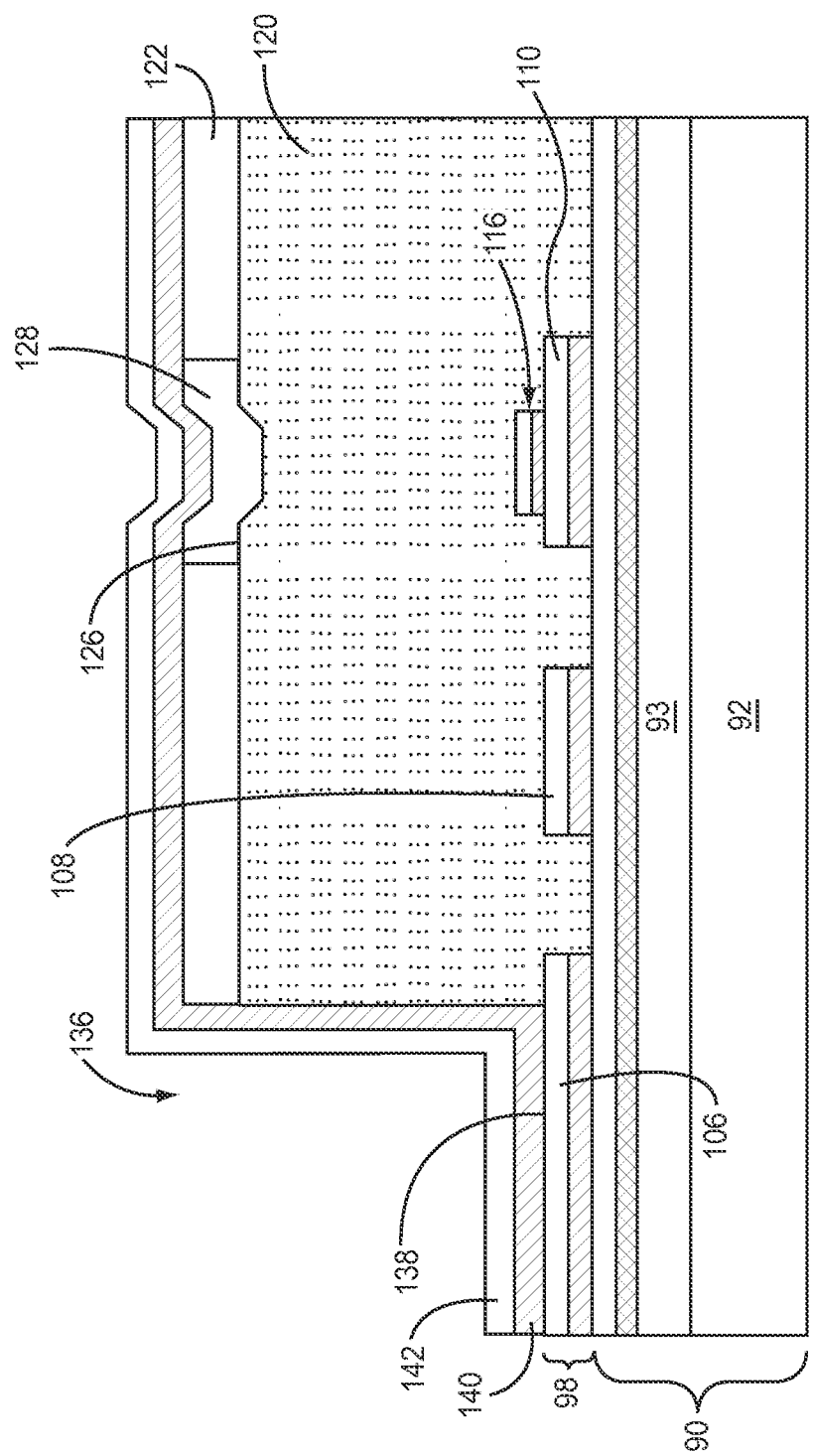

Next, at exposed area 124 (shown in FIG. 5F), a section of the first non-polymer based sacrificial layer 120 which creates an opening 136 in the first non-polymer based sacrificial layer 120 that exposes an area 138 of the anchor pad 106 (FIG. 5H). An attachment layer 140 may then be evaporated on the barrier layer 122, the hard conductive layer 128, and within the area 138 on the anchor pad 106 (FIG. 5I). A seed film 142 is then sputtered over the attachment layer 140 (FIG. 5J). The attachment layer 140 thereby attaches the seed film 142 onto the conductive layer 98, the first non-polymer based sacrificial layer 120, and the hard conductive layer 128. The seed film 142 may be made from a conductive material such as gold (Au) and the attachment layer 140 may be made from an adhesive material such as titanium (Ti) or chromium (Cr).

Figure 5K:
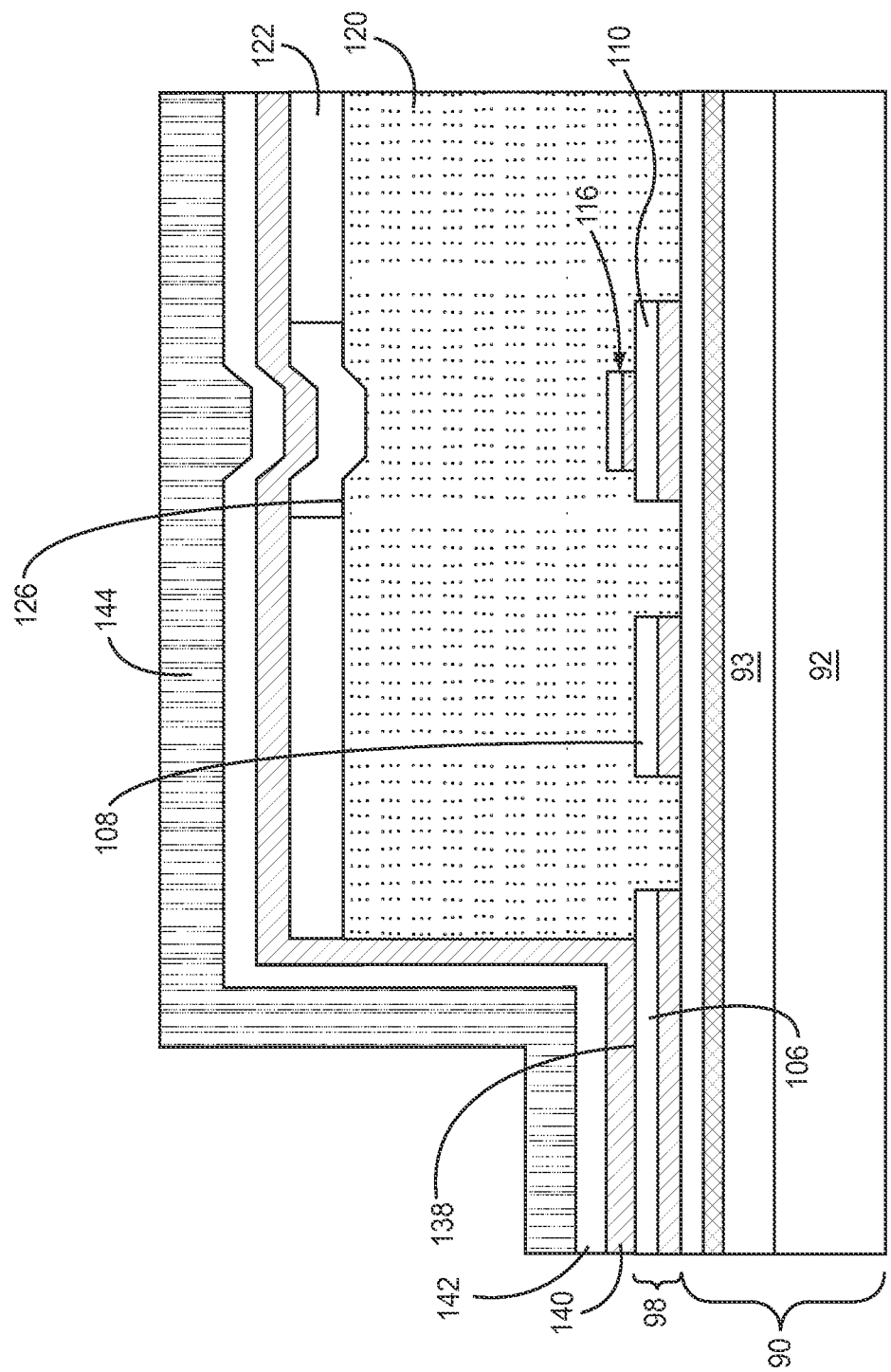
Figure 5L:
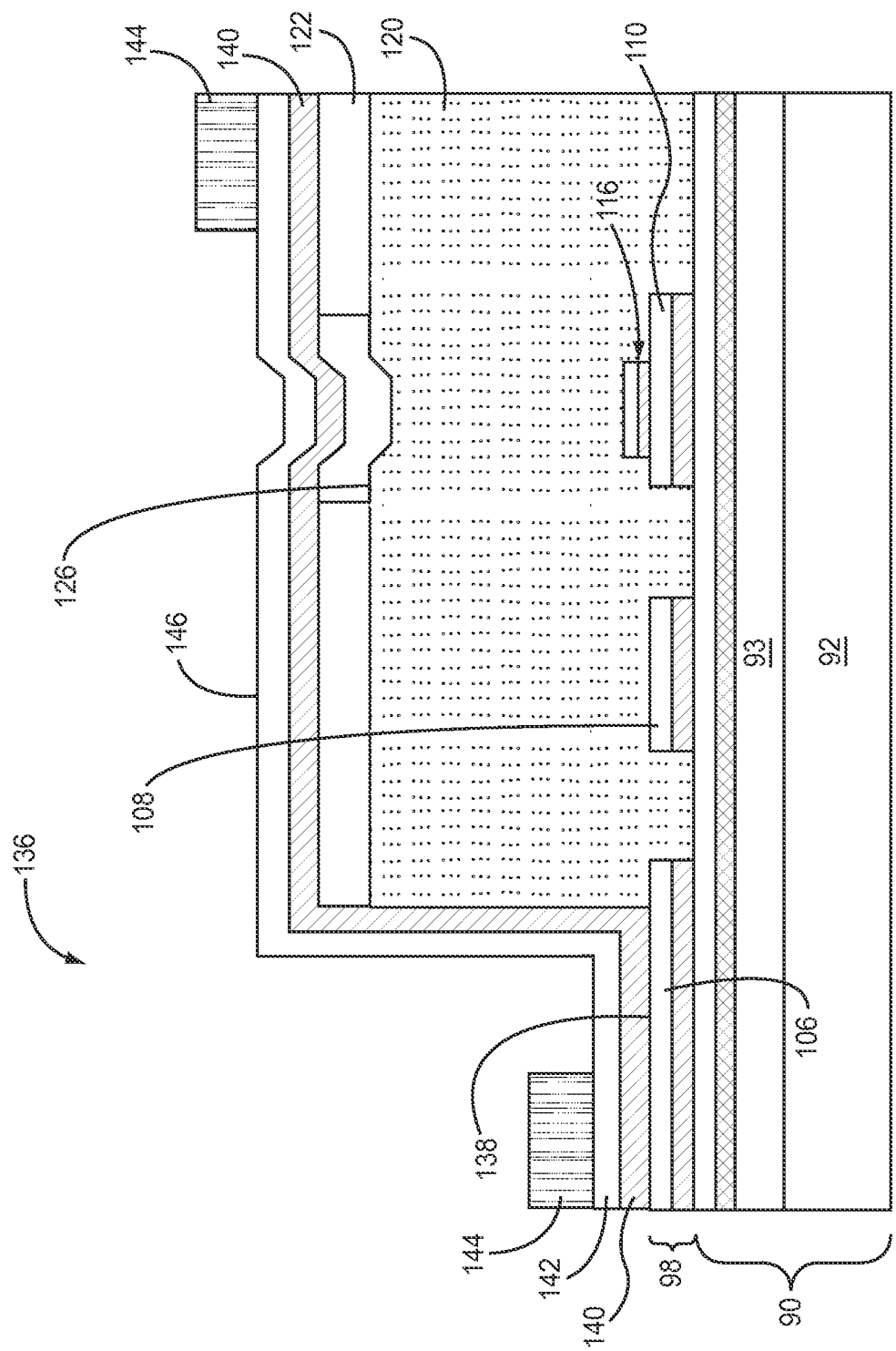

As shown in FIGS. 5K-5L, a photoresist mask 144 is provided on the seed film 142 and patterned over the first non-polymer based sacrificial layer 120 to provide for an electroplating area 146. A conductive material, such as gold (Au), is then electroplated onto the seed film 142 (FIG. 5M).

Figure 5M:
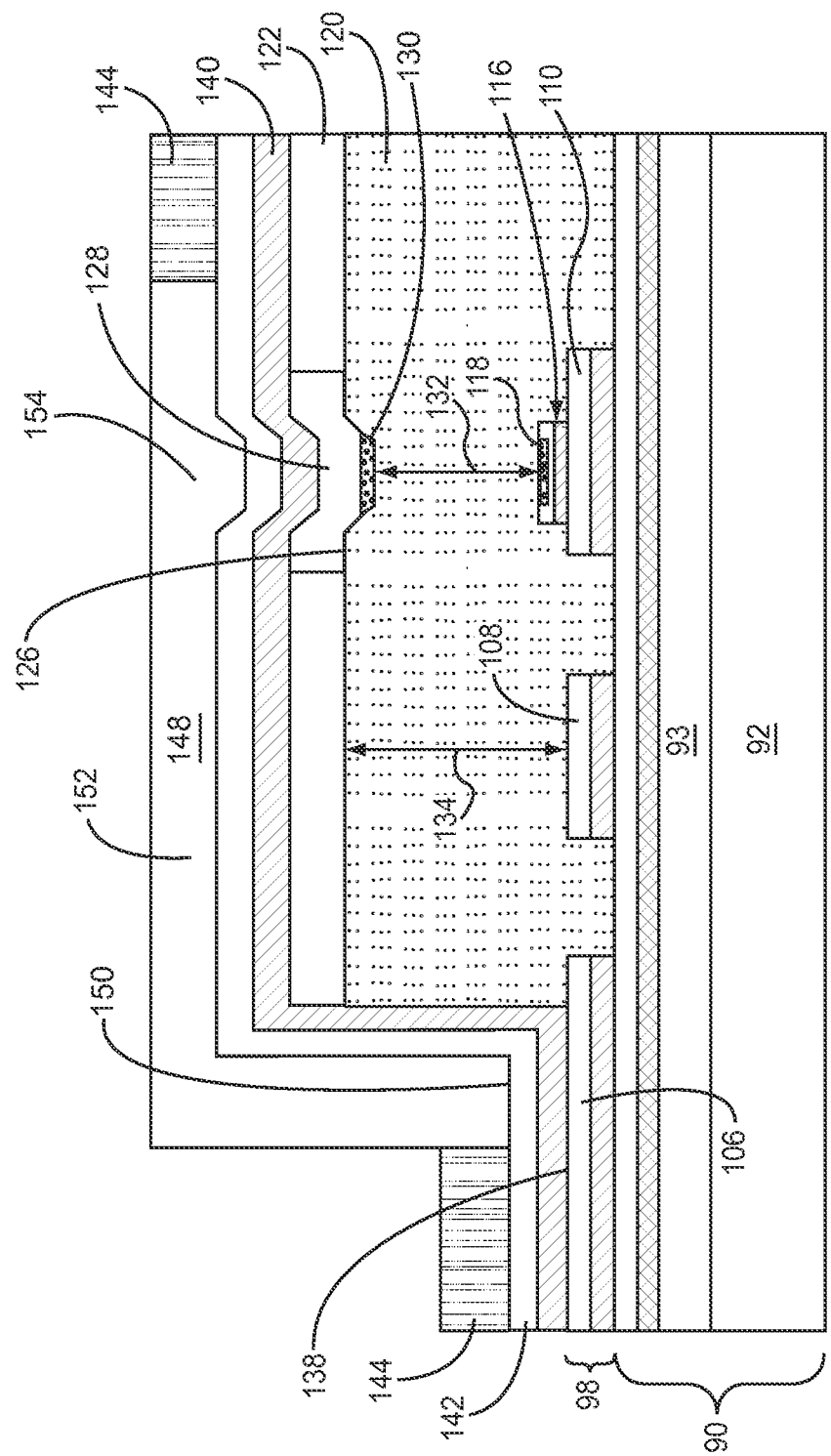

As illustrated in FIG. 5M, electroplating the seed film 142 forms an actuation member 148. The actuation member 148 may include an anchored end 150 attached to the anchor pad 106 on the area 138 (shown in FIG. 5H) in the opening 136 (shown in FIG. 5H). The actuation member 148 also includes an arm 152 and a contact portion 154. The attachment layer 140 also attaches the hard conductive layer 128 to the actuation member 148 so that the hard conductive layer 128 defines the contact area 130 of the actuation member 148.

The first non-polymer based sacrificial layer 120 thus provides a mold for the formation of the actuation member 148. The arm 152 of the actuation member 148 may be provided over the actuator plate 108 to define the actuator gap 134. Also, the contact portion 154 of the actuation member 148 is positioned so that the contact gap 132 is formed between the contact area 130 of the actuation member 148 and the contact area 118 of the bump pad 116. In the illustrated embodiment, the contact gap 132 may be smaller than the actuator gap 134.

Figure 5N:
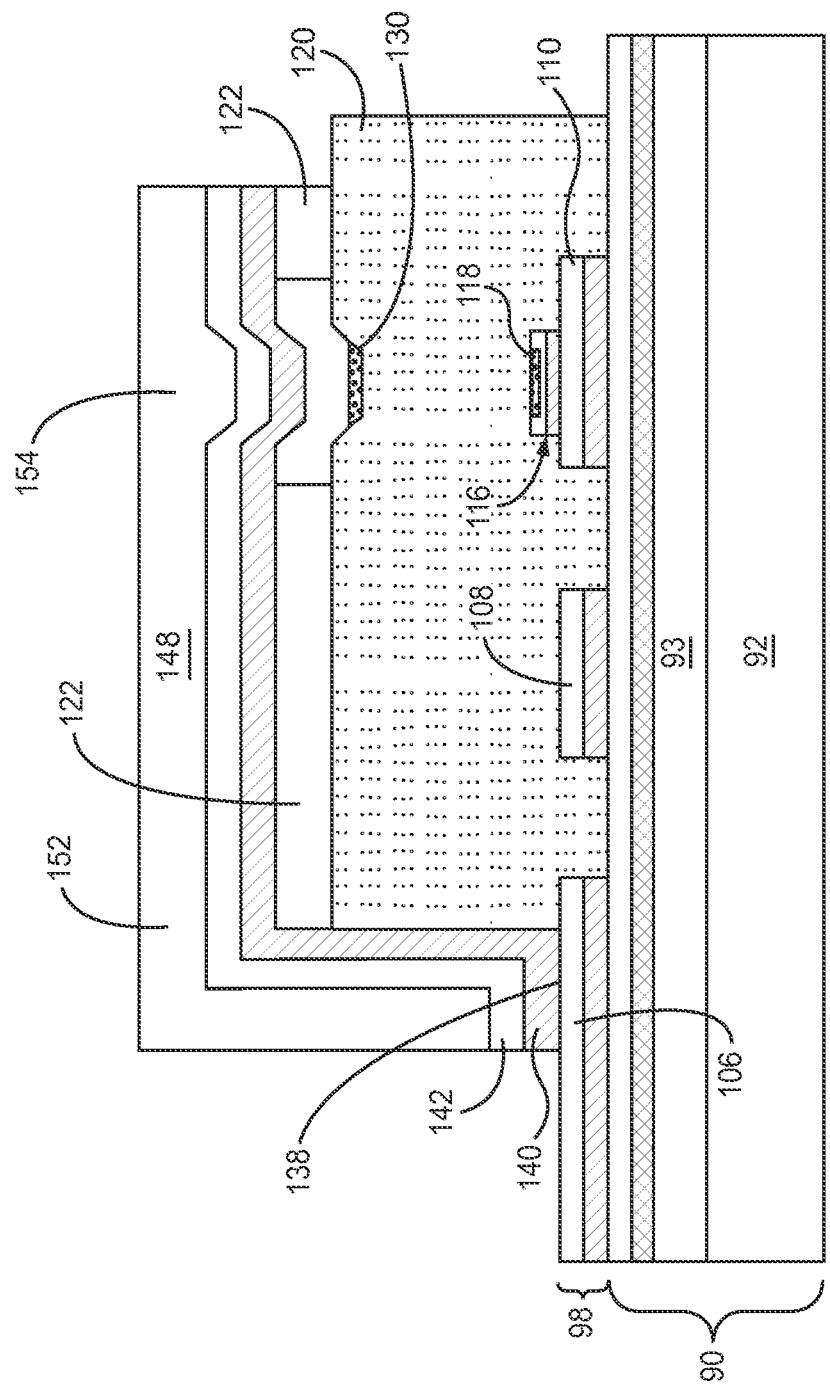
Figure 50:
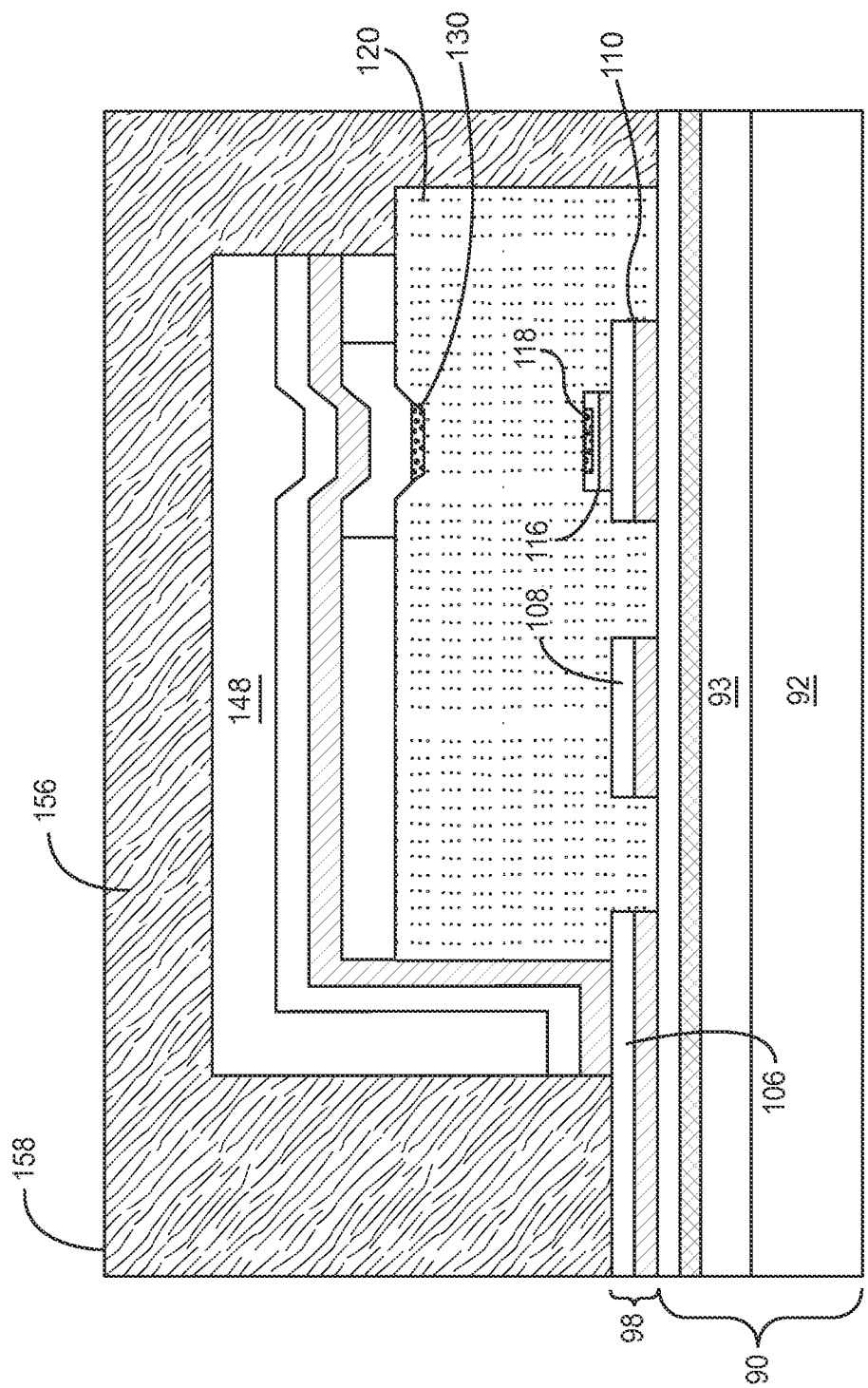

In FIG. 5N, the photoresist mask 144 is removed along with portions of the seed film 142, the attachment layer 140, the barrier layer 122 and the first non-polymer based sacrificial layer 120. However, the actuation member 148 is not released from the first non-polymer based sacrificial layer 120. In this manner, the contact area 118, the contact area 130, the anchor pad 106, the actuator plate 108, the contact pad 110, and the bump pad 116 are protected from contaminants by the first non-polymer based sacrificial layer 120.

Next, a second polymer based sacrificial layer 156 is deposited over the actuation member 148 (FIG. 5O). The advantage of using a second polymer based sacrificial layer 156 is the ease by which the second polymer based sacrificial layer 156 can be pattered and reflowed to provide a smooth profile. However, since the contact area 118, contact area 130, the anchor pad 106, the actuator plate 108, the contact pad 110, and the bump pad 116 are protected from contaminants by the first non-polymer based sacrificial layer 120, the problems associated with carbon contamination are reduced. In this embodiment, the second polymer based sacrificial layer 156 is made from a material such as polymethylglutarimide (PMGI).

Figure 5P:
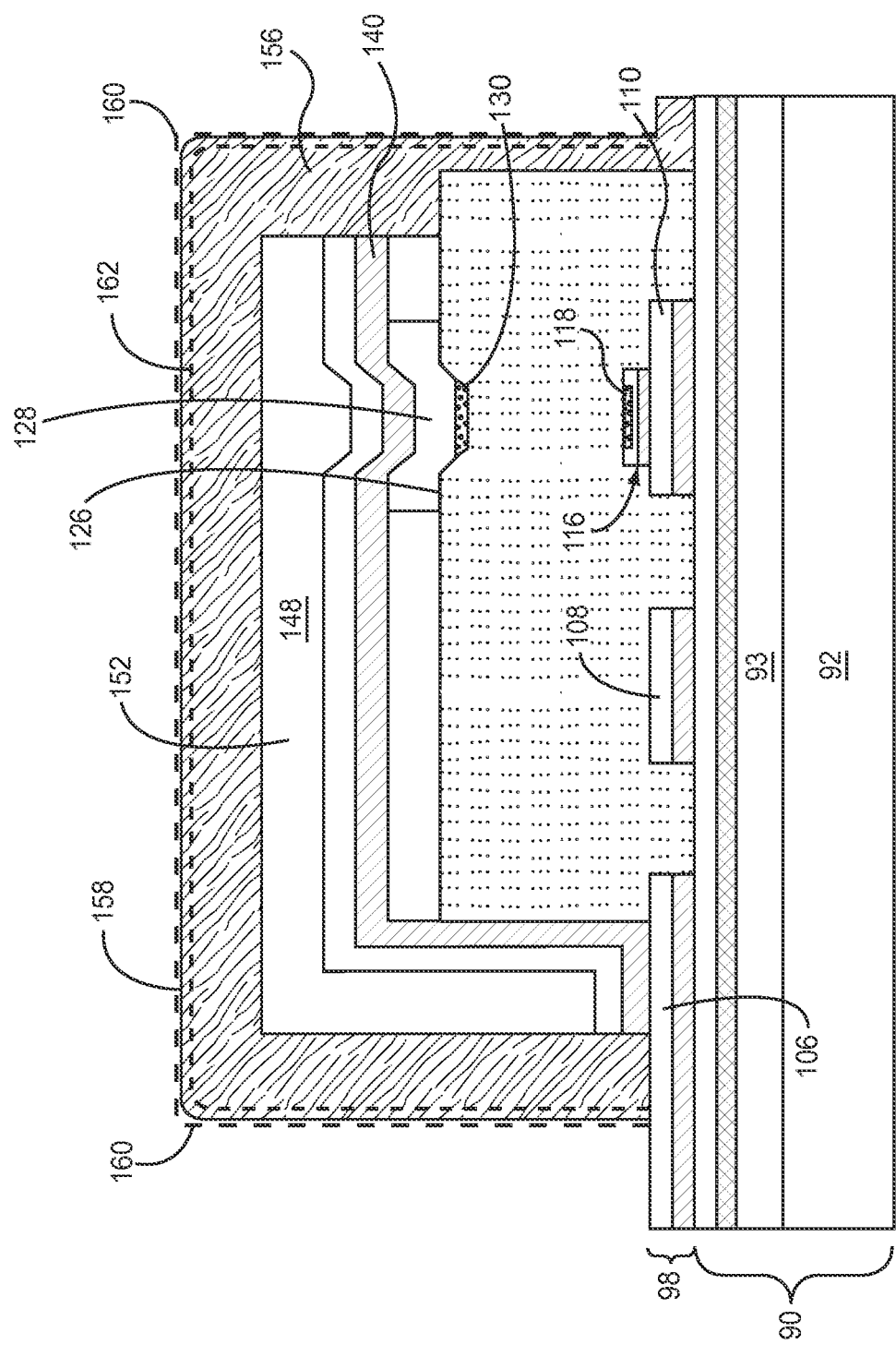
Figure 5Q:
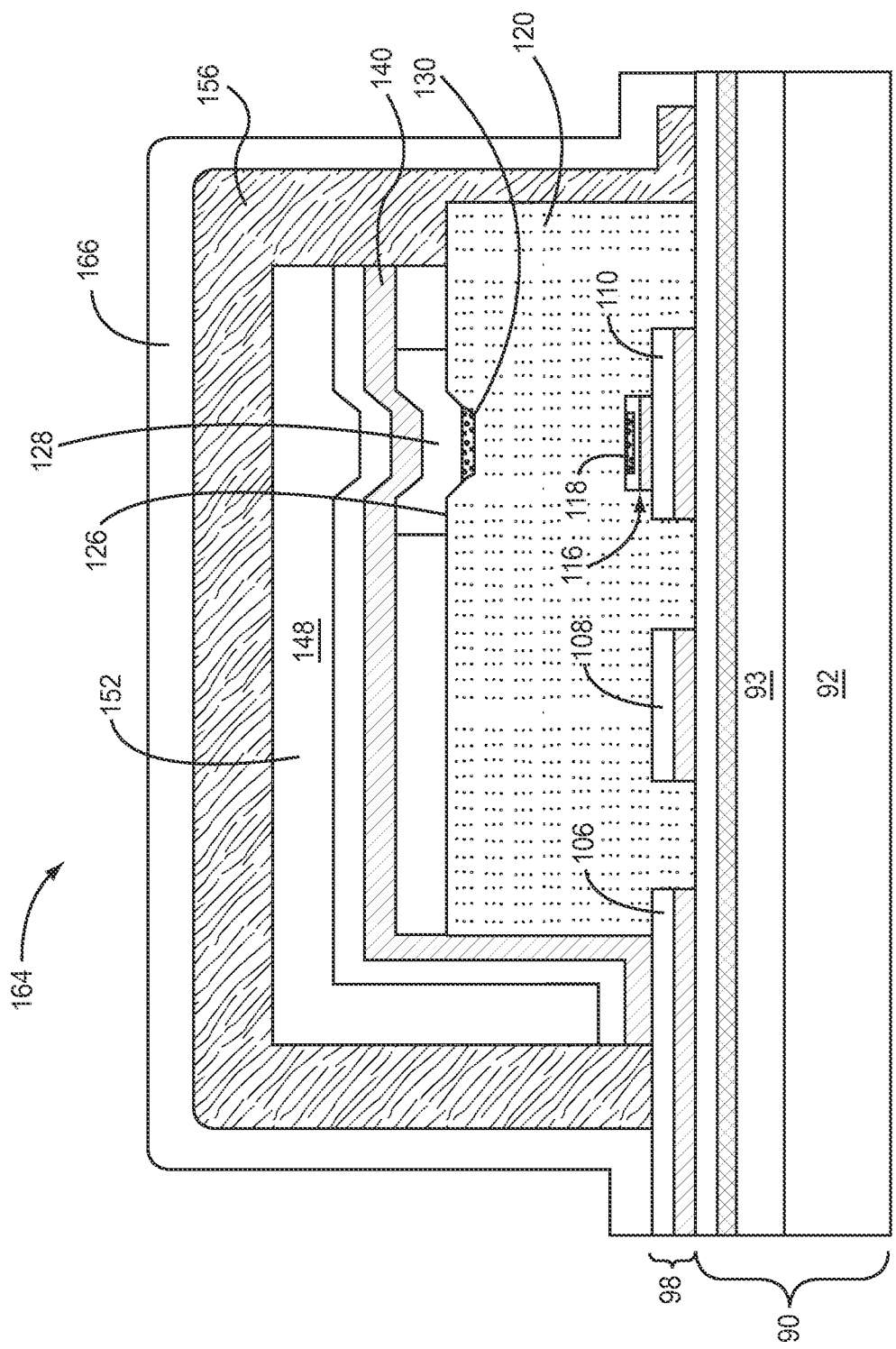

In FIG. 5P, the second polymer based sacrificial layer 156 is deposited so that the second polymer based sacrificial layer 156 covers the actuation member 148. Next, the second polymer based sacrificial layer 156 is patterned to define a profile 158. Generally, this profile 158 includes one or more corners 160. Thus, additionally, the corners 160 are reflowed to increase rounding of the corners 160 to provide a profile 162 after reflowing.

FIG. 5Q illustrates one embodiment of a fabrication device 164 for manufacturing an encapsulated micro-electromechanical system (MEMS) switch. Once the second polymer based sacrificial layer 156 has been patterned and reflowed, a first encapsulation layer 166 may be provided over the second polymer based sacrificial layer 156. The first encapsulation layer 166 encloses the actuation member 148, the actuator plate 108, and the contact pad 110 and may be made from a dielectric material, such as SiN or $SiO_x$.

After the fabrication device 164 has been formed, the MEMS switch can be manufactured from the fabrication device 164. To do this, the first non-polymer based sacrificial layer 120 and the second polymer based sacrificial layer 156 are removed. The first non-polymer based sacrificial layer 120 and the second polymer based sacrificial layer 156 may be removed simultaneously, or may be removed in different procedures. In one embodiment, the second polymer based sacrificial layer 156 is removed first. After removing the second polymer based sacrificial layer 156, the first non-polymer based sacrificial layer 120 is removed. This allows for the first non-polymer based sacrificial layer 120 to protect the contact area 118, contact area 130, the anchor pad 106, the actuator plate 108, the contact pad 110, and the bump pad 116 from carbon-based contaminants. However, the second polymer based sacrificial layer 156 allows for the encapsulation of the MEMS switch to be more compact and at the same time, structurally robust.

Figure 6A:
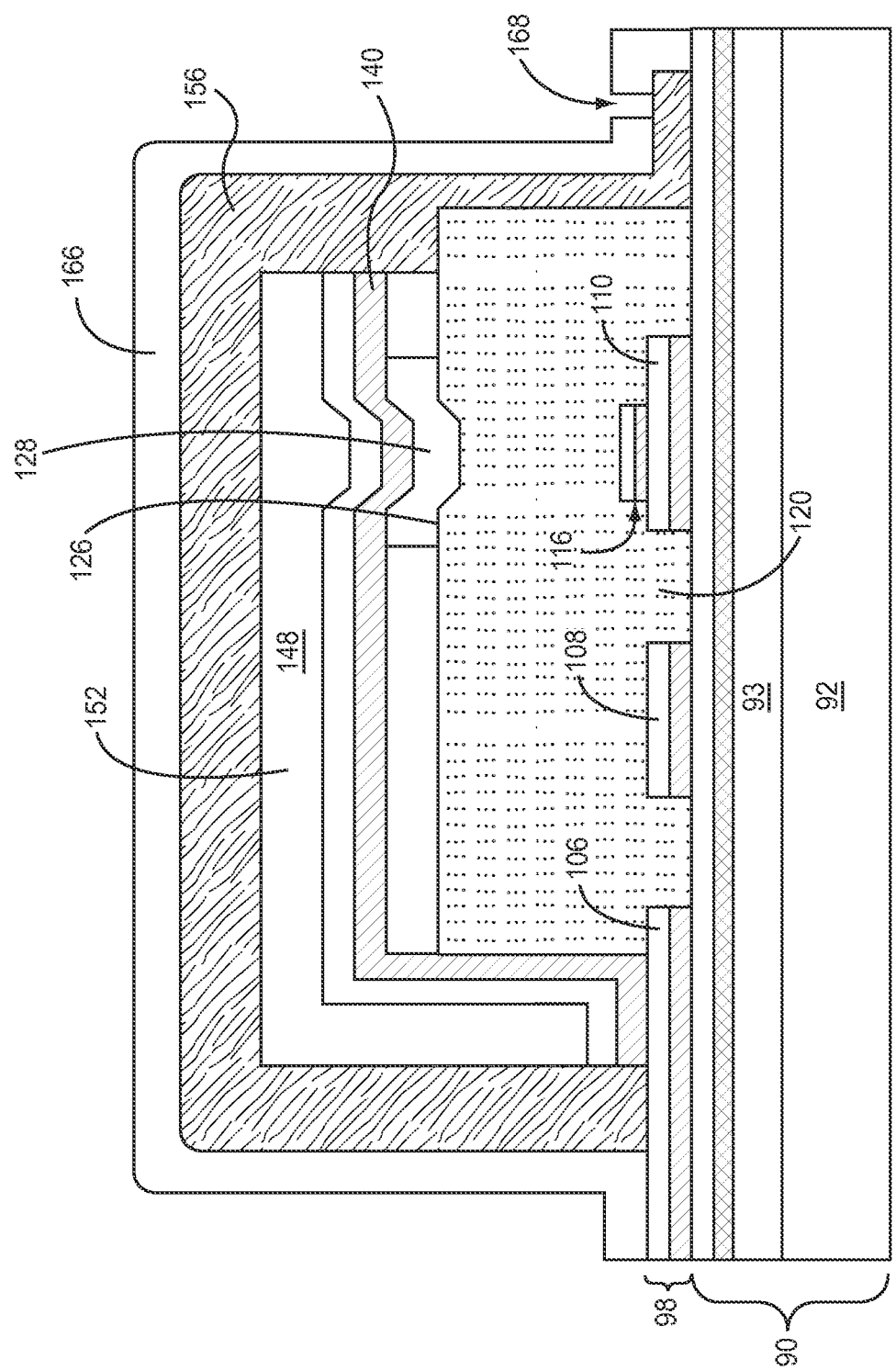
FIGS. 6A-6D illustrate exemplary procedures for manufacturing one embodiment of an encapsulated MEMS switch from the fabrication device made in accordance with the exemplary procedures described in FIGS. 5A-5Q.
Figure 6B:
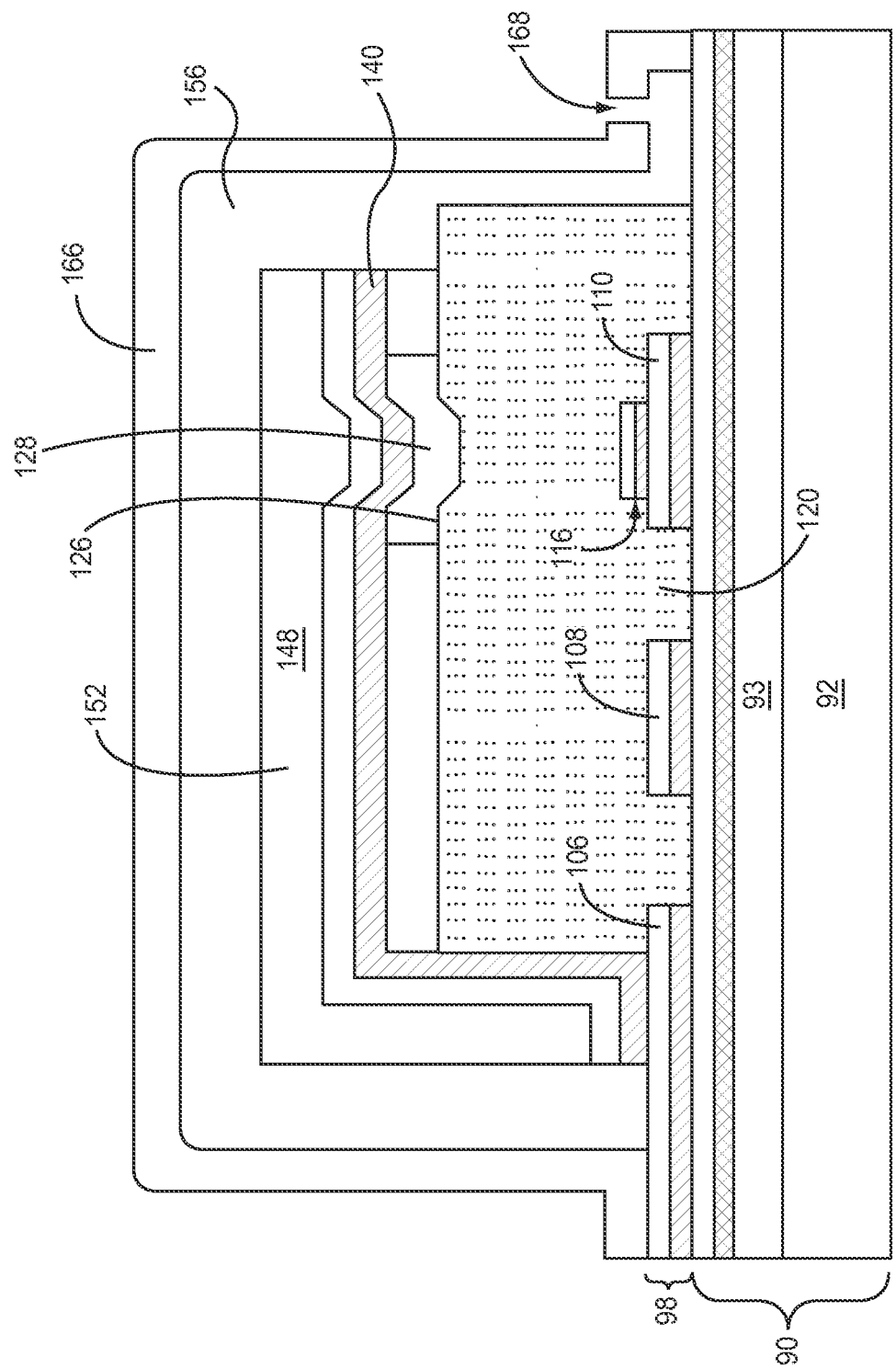

FIGS. 6A-6D illustrate exemplary procedures for creating one embodiment of a MEMS switch from the fabrication device 164 shown in FIG. 5Q. Prior to removing the second polymer based sacrificial layer 156, at least one aperture 168 is formed in the first encapsulation layer 166 (FIG. 6A). The first encapsulation layer 166 forms an enclosure and the aperture 168 allows for the entry of materials into the enclosure as well as removal of sacrificial materials from the enclosure. Once the aperture 168 has been formed, a first wet etchant is used and provided through the aperture 168 and releases the second polymer based sacrificial layer 156. For example, the first wet etchant may be an N-Methyl-2-pyrrolidone (NMP) developer which releases the second polymer based sacrificial layer 156 while maintaining the first non-polymer based sacrificial layer 120 intact. Thus, the first non-polymer based sacrificial layer 120 provides protection from carbon based contamination during the release of the second polymer based sacrificial layer 156. The remnants of the second polymer based sacrificial layer 156 and the first wet etchant may be removed through the aperture 168 (FIG. 6B). Following this wet etching, a dry etching step may be further applied to clean the inside of first encapsulation layer 166 of any remaining organic or carbon contaminants. The dry etching step may be an oxygen plasma.

Figure 6C:
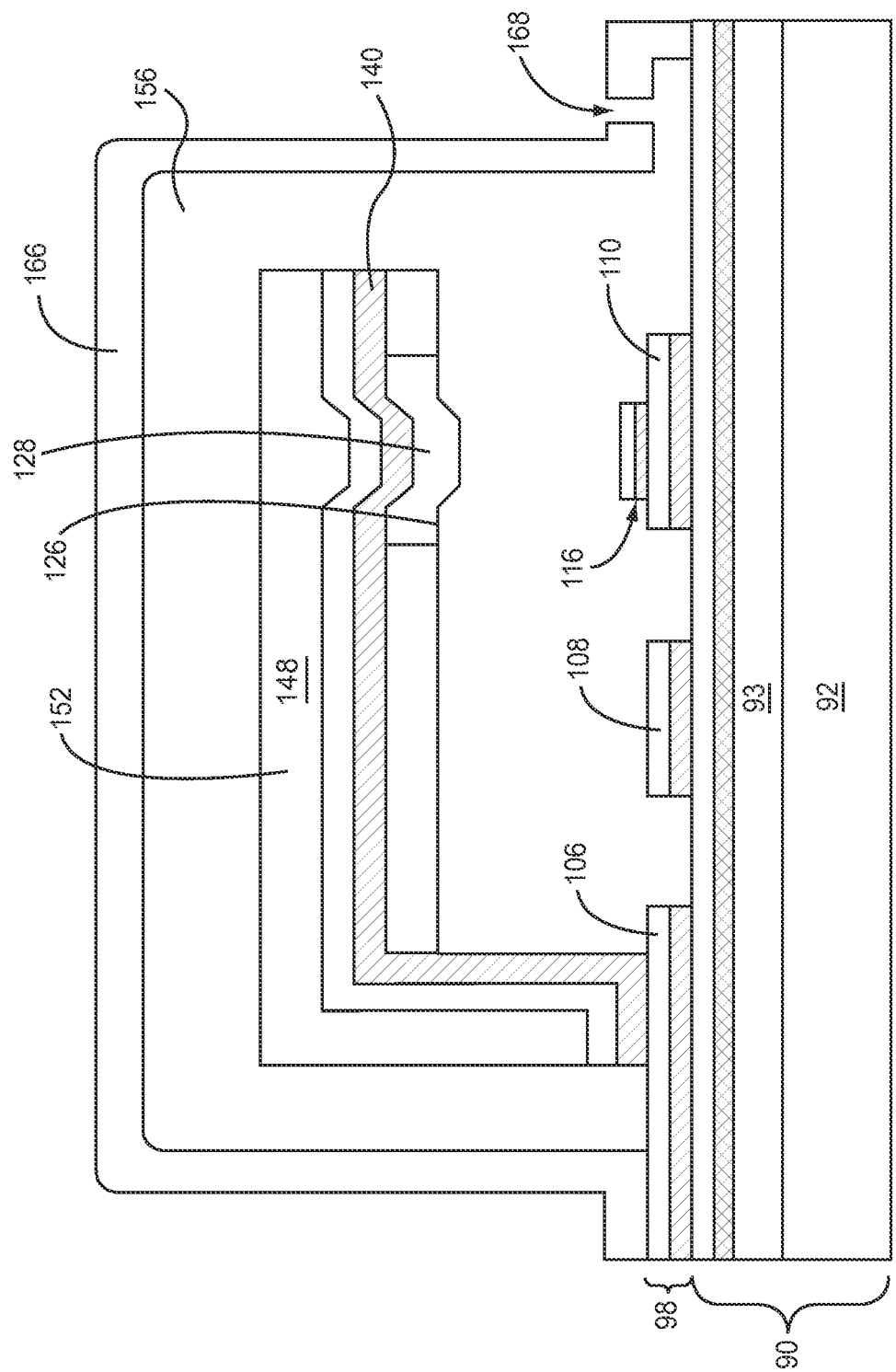

Next, a second wet etchant may be used and provided through the aperture 168 to release the first non-polymer based sacrificial layer 120. For example, if the first non-polymer based sacrificial layer 120 is made from a metal, such as Cu, a tetramethylammonium hydroxide (TMAH) developer can be utilized to release the first non-polymer based sacrificial layer 120. The remnants of the first non-polymer based sacrificial layer 120 and the second wet etchant may be removed through the aperture 168 (FIG. 6C).

Once the first non-polymer based sacrificial layer 120 and the second polymer based sacrificial layer 156 have been removed, the first encapsulation layer 166 may be hermetically sealed. As shown in FIG. 6C, the enclosure defined by the first encapsulation layer 166 encloses the actuation member 148, the actuator plate 108, the contact pad 110, and the bump pad 116. The anchor pad 106 is at least partially enclosed as well.

Figure 6D:
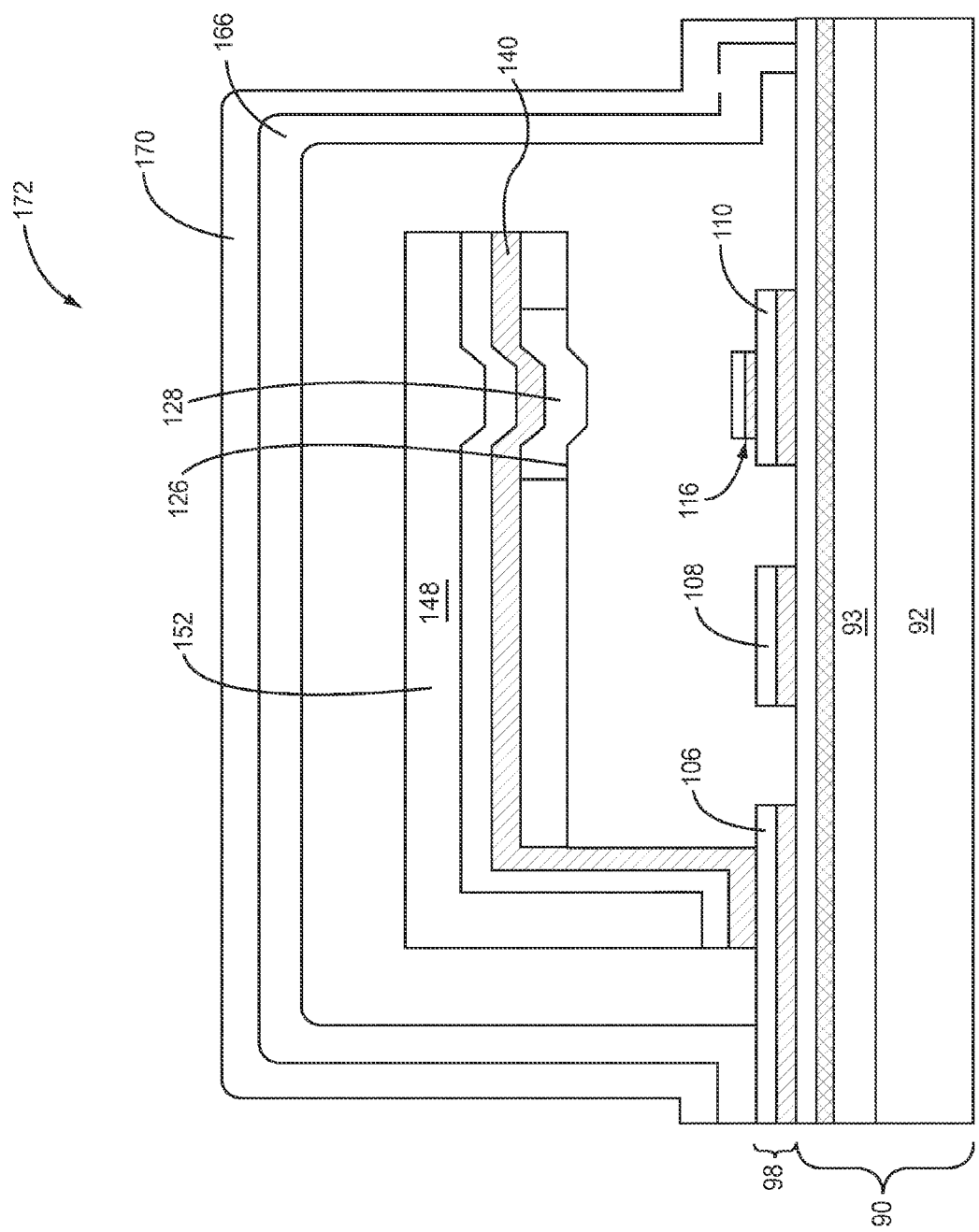

To hermetically seal the enclosure, a vacuum is created within an interior of the enclosure defined by the first encapsulation layer 166. Next, the aperture 168 (and any other apertures that may have been provided) are sealed so that the actuation member 148, the actuator plate 108, the contact pad 110, and the bump pad 116 are hermetically sealed within the enclosure (FIG. 6D). In this example, a second encapsulation layer 170 is provided over the first encapsulation layer 166 to seal the aperture 168. The second encapsulation layer 170 may be made from a material, such as SiN or $SiO_x$ as well. FIG. 6D illustrates one embodiment of an encapsulated MEMS switch 172 that was manufactured utilizing procedures described above using FIGS. 5A-5Q and 6A-6D.

Figure 7:
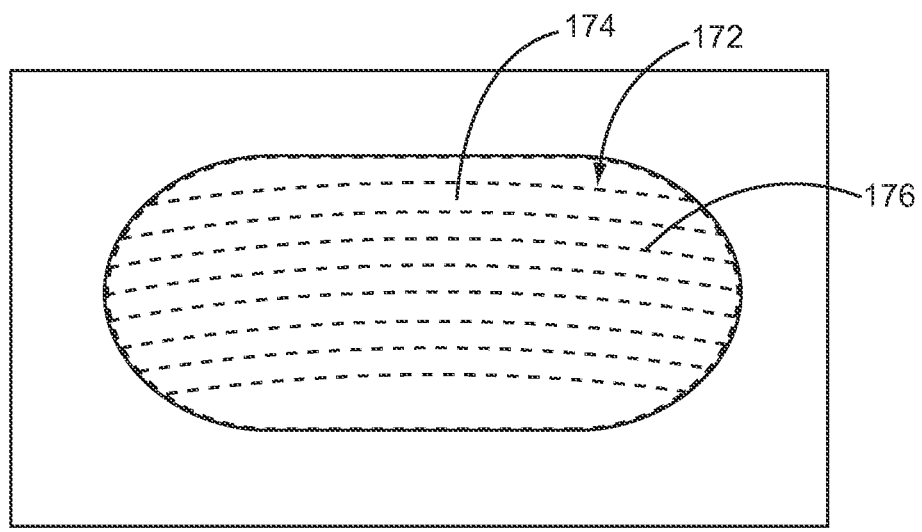
FIG. 7 is a perspective view of the encapsulated MEMS switch manufactured in accordance with the exemplary procedures described in FIGS. 5A-5Q and FIGS. 6A-6D.

FIG. 7 is a top perspective view from an exterior of one embodiment of a domed-shaped enclosure 174 that encapsulates the encapsulated MEMS switch 172 shown in FIG. 6D. Note the smooth reflowed shape provided by a profile 176 (represented by dashed lines) of the domed-shaped enclosure 174. This profile 176 is enabled by the second polymer based sacrificial layer 156 and clearly demonstrates that the encapsulated MEMS switch 172 has an increased spatial efficiency compared to other encapsulated MEMS switches. It may also has increased structural robustness and integrity compared with MEMS switches encapsulated with non-reflowed non-domed-shaped enclosures. These encapsulated MEMS switches have been demonstrated to survive and remain hermetic thru subsequent wafer processing as well as plastic over molding.

While the same polymer sacrificial materials which enable this reflow shape can introduce carbon contaminants, the first non-polymer based sacrificial layer 120 protects the encapsulated MEMS switch 172 from these contaminants providing clean contacts and therefore reduced contact resistance. Furthermore, the absence of these contaminants increases the performance and lifetime of the encapsulated MEMS switch 172.

Those skilled in the art will recognize improvements and modifications to the preferred embodiments of the present disclosure. All such improvements and modifications are considered within the scope of the concepts disclosed herein and the claims that follow.

What is claimed is:

1. A method for manufacturing a micro-electromechanical system (MEMS) switch, comprising:
   providing a substrate;
   providing an actuator plate and a contact pad over the substrate;
   providing a first non-polymer based sacrificial layer over the actuator plate and the contact pad;
   forming a patterned barrier layer over the first non-polymer based sacrificial layer, wherein a first area of the first non-polymer based sacrificial layer is exposed through the patterned barrier layer and aligned over the contact pad;
   forming an actuation member over the patterned barrier layer;
   providing a second polymer based sacrificial layer over the actuation member;
   providing a first encapsulation layer over the second polymer based sacrificial layer, wherein the first encapsulation layer encloses the actuation member, the actuator plate, and the contact pad; and
   removing the first non-polymer based sacrificial layer and the second polymer based sacrificial layer.

2. The method of claim 1, wherein removing the first non-polymer based sacrificial layer and the second polymer based sacrificial layer, comprises:
   removing the second polymer based sacrificial layer; and
   after removing the second polymer based sacrificial layer, removing the first non-polymer based sacrificial layer.

3. The method of claim 2, wherein removing the first non-polymer based sacrificial layer and the second polymer based sacrificial layer further comprises:
   prior to removing the second polymer based sacrificial layer, forming at least one aperture in the first encapsulation layer.

4. The method of claim 3, wherein removing the second polymer based sacrificial layer comprises:
   using a first wet etchant provided through the at least one aperture, wherein the first wet etchant releases the second polymer based sacrificial layer.

5. The method of claim 4, wherein removing the first non-polymer based sacrificial layer comprises:
   using a second wet etchant provided through the at least one aperture, wherein the second wet etchant releases the first non-polymer based sacrificial layer.

6. The method of claim 3, further comprising:
   after removing first non-polymer based sacrificial layer and the second polymer based sacrificial layer, hermetically sealing the at least one aperture so that the actuation member, the actuator plate, and the contact pad within the enclosure.

7. The method of claim 6, wherein sealing the at least one aperture comprises:
   providing a second encapsulation layer over the first encapsulation layer that seals the at least one aperture.

8. The method of claim 1, further comprising providing an anchor pad over the substrate.

9. The method of claim 8, wherein providing the first non-polymer based sacrificial layer over the actuator plate and the contact pad further comprises:
   providing the first non-polymer based sacrificial layer over the anchor pad; and
   removing a section of the first non-polymer based sacrificial layer to expose an area of the anchor pad.

10. The method of claim 9, wherein further comprises:
    forming the actuation member on the first non-polymer based sacrificial layer so that the actuation member is attached to the area of the anchor pad.

11. The method of claim 1, wherein the first non-polymer based sacrificial layer is one of a group consisting of a metal sacrificial layer, a dielectric sacrificial layer, and a semiconductor sacrificial layer.

12. The method of claim 11, wherein the second polymer based sacrificial layer consists of a polymethylglutarimide layer.

13. The method of claim 1, wherein providing the second polymer based sacrificial layer over the actuation member further comprises:
    depositing the second polymer based sacrificial layer so that the second polymer based sacrificial layer covers the actuation member; and
    patterning the second polymer based sacrificial layer so that a profile of the second polymer based sacrificial layer defines at least one corner; and
    reflowing the at least one corner to increase rounding of the at least one corner defined by the profile.

14. The method of claim 13, providing the first non-polymer based sacrificial layer over the actuator plate and the contact pad comprises providing the first non-polymer based sacrificial layer so that the first non-polymer based sacrificial layer covers the actuator plate and the contact pad.

15. The method of claim 1, wherein providing the actuator plate and the contact pad over the substrate, comprises:
    providing a conductive layer over the substrate; and
    forming the actuator plate and the contact pad from the conductive layer.

16. The method of claim 1 further comprising forming a hard conductive layer that extends through the patterned barrier layer and is in contact with the first area of the first non-polymer based sacrificial layer, wherein the hard conductive layer is electrically coupled to the actuation member.

17. The method of claim 16, wherein a recess is formed at the first area of the first non-polymer based sacrificial layer and the hard conductive layer extends into the recess.

18. The method of claim 1, wherein the actuation member comprises an arm and a contact portion, wherein:
the arm is over the actuator plate; and
the contact portion protrudes from the arm and toward the first area of the first non-polymer based sacrificial layer.

19. The method of claim 18 further comprising forming a hard conductive layer that extends through the patterned barrier layer, is aligned underneath the contact portion, and is in contact with the first area of the first non-polymer based sacrificial layer, wherein the hard conductive layer is electrically coupled to the actuation member.

20. A fabrication device for manufacturing an encapsulated micro-electromechanical system (MEMS) switch, comprising:
a substrate;
an actuator plate over the substrate;
a contact pad over the substrate;
a first non-polymer based sacrificial layer over the actuator plate and the contact pad,
a patterned barrier layer over the first non-polymer based sacrificial layer, wherein a first area of the first non-polymer based sacrificial layer is exposed through the patterned barrier layer and aligned over the contact pad;
an actuation member over the patterned barrier layer;
a second polymer based sacrificial layer over the actuation member; and
a first encapsulation layer over the second polymer based sacrificial layer, wherein the first encapsulation layer encloses the actuation member, the actuator plate, and the contact pad.

21. The fabrication device of claim 20, wherein the first non-polymer based sacrificial layer is one of a group consisting of a metal sacrificial layer, a dielectric sacrificial layer, and a semiconductor sacrificial layer.

22. The fabrication device of claim 21, wherein the second polymer based sacrificial layer consists of a polymethylglutarimide layer.

23. The fabrication device of claim 20 further comprising a hard conductive layer that extends through the patterned barrier layer and is in contact with the first area of the first non-polymer based sacrificial layer, wherein the hard conductive layer is electrically coupled to the actuation member.

24. The fabrication device of claim 23, wherein a recess is formed at the first area of the first non-polymer based sacrificial layer and the hard conductive layer extends into the recess.

25. The fabrication device of claim 20, wherein
the actuation member comprises an arm and a contact portion, wherein:
the arm is over the actuator plate; and
the contact portion protrudes from the arm and toward the first area of the first non-polymer based sacrificial layer.

26. The fabrication device of claim 25 further comprising a hard conductive layer that extends through the patterned barrier layer, is aligned underneath the contact portion, and is in contact with the first area of the first non-polymer based sacrificial layer, wherein the hard conductive layer is electrically coupled to the actuation member.

27. The fabrication device of claim 20, further comprising:
an anchor pad over the substrate, wherein the actuation member is attached to the anchor pad.

28. The fabrication device of claim 20, wherein the first encapsulation layer forms a domed-shaped enclosure that encloses the actuation member, the actuator plate, and the contact pad.

* * * * *